US012777781B2

(12) United States Patent
Han et al.

(10) Patent No.: US 12,777,781 B2
(45) Date of Patent: Oct. 27, 2026

(54) DISPLAY DEVICE

(71) Applicant: LG Display Co., Ltd, Seoul (KR)

(72) Inventors: Bumhee Han, Gyeonggi-do (KR); JiWon Kim, Gyeonggi-do (KR); MinSeob Song, Gyeonggi-do (KR)

(73) Assignee: LG Display Co., Ltd. (KR)

( * ) Notice: Subject to any disclaimer, the term of this patent is extended or adjusted under 35 U.S.C. 154(b) by 283 days.

(21) Appl. No.: 18/535,631

(22) Filed: Dec. 11, 2023

(65) Prior Publication Data

US 2024/0215329 A1 Jun. 27, 2024

(30) Foreign Application Priority Data

Dec. 23, 2022 (KR) ........................ 10-2022-0183492

(51) Int. Cl.
*H10K 59/122* (2023.01)
*G06F 3/041* (2006.01)
(Continued)

(52) U.S. Cl.
CPC ......... *H10K 59/122* (2023.02); *G06F 3/0412* (2013.01); *G06F 3/0443* (2019.05); *G06F 3/0446* (2019.05); *H10K 59/126* (2023.02); *H10K 59/40* (2023.02); *G06F 2203/04107* (2013.01); *G06F 2203/04111* (2013.01)

(58) Field of Classification Search
CPC .. H10K 59/122; H10K 59/126; G06F 3/0412; G06F 3/0443; G06F 3/0446
See application file for complete search history.

(56) References Cited

U.S. PATENT DOCUMENTS 10,431,142 B2 * 10/2019 Cheng .................. G06F 3/1446
10,572,092 B2 * 2/2020 Shimizu .................. G06F 3/045
(Continued)

FOREIGN PATENT DOCUMENTS

CN 104076965 A 10/2014
CN 108227978 A * 6/2018 ........... G06F 3/0412
(Continued)

OTHER PUBLICATIONS

Japanese Office Action issued on Sep. 3, 2024 issued in Patent Application No. 2023-210469 with English translation (8 pages).
(Continued)

*Primary Examiner* — Laura M Menz
(74) *Attorney, Agent, or Firm* — Fish & Richardson P.C.

(57) ABSTRACT

A display device includes a substrate which includes a display area including a first optical area and a normal area and a non-display area, a planarization layer disposed on the substrate, a plurality of light emitting diodes disposed on the planarization layer and includes an anode, an emission layer, and a cathode, a bank disposed to cover an end of the anode on the planarization layer, an encapsulation unit disposed to cover the plurality of light emitting diodes and the bank, a touch sensing unit disposed on the encapsulation unit and includes a plurality of touch electrodes, and a plurality of shielding patterns disposed between the encapsulation unit and the plurality of touch electrodes in the first optical area. The first optical area includes a transmission area in which the cathode exposes the bank.

11 Claims, 19 Drawing Sheets

(51) Int. Cl.
*G06F 3/044* (2006.01)
*H10K 59/126* (2023.01)
*H10K 59/40* (2023.01)

(56) References Cited

U.S. PATENT DOCUMENTS

| | | | | | |
|---|---|---|---|---|---|
| 10,720,474 | B2 * | 7/2020 | Hwang | G06F 3/04166 | |
| 10,838,539 | B2 * | 11/2020 | Hwang | G06F 3/0416 | |
| 11,275,476 | B2 * | 3/2022 | Bang | G06F 3/0446 | |
| 11,581,515 | B2 * | 2/2023 | Baek | G06F 3/0412 | |
| 11,605,682 | B2 | 3/2023 | Ying et al. | | |
| 11,839,107 | B2 * | 12/2023 | Baek | G06F 3/0412 | |
| 11,934,618 | B2 * | 3/2024 | Park | G06F 3/03545 | |
| 12,058,914 | B2 * | 8/2024 | Han | G06F 3/04182 | |
| 12,238,964 | B2 * | 2/2025 | Baek | G06F 3/0412 | |
| 12,501,814 | B2 * | 12/2025 | Jung | H10D 86/411 | |
| 12,518,502 | B2 * | 1/2026 | Kim | G06V 10/24 | |
| 2012/0034888 | A1 | 2/2012 | De Flaviis | | |
| 2018/0089485 | A1 | 3/2018 | Bok | | |
| 2018/0137815 | A1 * | 5/2018 | Cheng | G06F 3/1446 | |
| 2018/0150671 | A1 | 5/2018 | Choo et al. | | |
| 2018/0166507 | A1 * | 6/2018 | Hwang | G06F 3/04166 | |
| 2019/0250734 | A1 * | 8/2019 | Lee | H01Q 9/30 | |
| 2020/0210014 | A1 * | 7/2020 | Oh | G06F 3/0412 | |
| 2020/0272267 | A1 | 8/2020 | Xu et al. | | |
| 2021/0135166 | A1 * | 5/2021 | Baek | G06F 3/0412 | |
| 2021/0200357 | A1 * | 7/2021 | Lee | G06F 3/0412 | |
| 2021/0232267 | A1 * | 7/2021 | Bang | G06F 3/0446 | |
| 2021/0313405 | A1 | 10/2021 | Xu et al. | | |
| 2022/0069042 | A1 | 3/2022 | Jung et al. | | |
| 2022/0206620 | A1 * | 6/2022 | Lee | G06F 3/0412 | |
| 2022/0214770 | A1 * | 7/2022 | Bang | G06F 3/0446 | |
| 2022/0406869 | A1 * | 12/2022 | Bang | G06F 3/0412 | |
| 2023/0036586 | A1 * | 2/2023 | Jeon | H10K 59/131 | |
| 2023/0093856 | A1 * | 3/2023 | Kim | G06F 3/0443 | 345/174 |
| 2023/0113069 | A1 * | 4/2023 | Baek | G06F 3/0412 | 257/91 |
| 2023/0217778 | A1 * | 7/2023 | Han | G06F 3/04182 | 345/173 |
| 2023/0301158 | A1 * | 9/2023 | Jung | H10D 86/411 | |
| 2023/0329059 | A1 * | 10/2023 | Lee | H10K 59/122 | 257/40 |
| 2024/0032328 | A1 * | 1/2024 | Baek | G06F 3/0412 | |
| 2024/0203875 | A1 * | 6/2024 | Kim | G11C 16/0483 | |
| 2024/0203943 | A1 * | 6/2024 | Kim | H10B 43/27 | |
| 2024/0215329 | A1 * | 6/2024 | Han | H10K 59/122 | |
| 2024/0237340 | A1 * | 7/2024 | Kim | H10B 41/10 | |
| 2024/0244933 | A1 * | 7/2024 | Han | H10K 59/8731 | |
| 2024/0251640 | A1 * | 7/2024 | Kim | H10K 59/80521 | |
| 2025/0173014 | A1 * | 5/2025 | Baek | G06F 3/0412 | |
| 2025/0268040 | A1 * | 8/2025 | Kang | H10D 86/423 | |
| 2025/0299460 | A1 * | 9/2025 | Kim | H04N 23/23 | |
| 2025/0304445 | A1 * | 10/2025 | Kwak | B01D 53/04 | |
| 2025/0311556 | A1 * | 10/2025 | Song | H10K 59/122 | |
| 2025/0337724 | A1 * | 10/2025 | Kim | H04L 63/0815 | |
| 2025/0368031 | A1 * | 12/2025 | Kim | B60K 15/063 | |
| 2026/0018392 | A1 * | 1/2026 | Kwon | H01J 37/32715 | |
| 2026/0028400 | A1 * | 1/2026 | Min | C07K 14/7051 | |

FOREIGN PATENT DOCUMENTS

| | | | | | |
|---|---|---|---|---|---|
| CN | 106020553 | B | * | 1/2021 | G06F 3/0414 |
| CN | 108227978 | B | * | 9/2021 | G06F 3/0412 |
| CN | 109388279 | B | * | 12/2023 | G06F 3/0412 |
| CN | 110928436 | B | * | 3/2024 | H10K 59/131 |
| CN | 113126806 | B | * | 4/2024 | G06F 3/0412 |
| CN | 118215349 | A | * | 6/2024 | G02F 1/1362 |
| CN | 118251061 | A | * | 6/2024 | H10K 59/873 |
| CN | 118338727 | A | * | 7/2024 | G06F 3/0412 |
| CN | 120529779 | A | * | 8/2025 | H10D 86/423 |
| DE | 102023135519 | A1 | * | 7/2024 | H10K 59/873 |
| DE | 102024100189 | A1 | * | 7/2024 | G06F 3/0412 |
| EP | 3333682 | A1 | * | 6/2018 | G06F 3/04144 |
| EP | 3333682 | B1 | * | 6/2022 | G06F 3/0447 |
| EP | 4040486 | A1 | | 8/2022 | |
| EP | 4181649 | A1 | * | 5/2023 | H10K 59/131 |
| EP | 4181649 | B1 | * | 1/2026 | G09G 3/3266 |
| GB | 2626844 | A | * | 8/2024 | H10K 59/873 |
| JP | 2018-087973 | A | | 6/2018 | |
| JP | 2018097869 | A | * | 6/2018 | G06F 3/0412 |
| JP | 6498262 | B2 | * | 4/2019 | G06F 3/0412 |
| JP | 2021-039755 | A | | 3/2021 | |
| JP | 2021-060968 | A | | 4/2021 | |
| KR | 10-2018-0033361 | A | | 4/2018 | |
| KR | 10-2018-0066667 | A | | 6/2018 | |
| KR | 20190003184 | A | * | 1/2019 | G06F 3/044 |
| KR | 20200002299 | A | | 1/2020 | |
| KR | 20210086142 | A | * | 7/2021 | G06F 3/044 |
| KR | 20210086245 | A | * | 7/2021 | H10K 59/8731 |
| KR | 20220170385 | A | * | 12/2022 | G06F 3/04164 |
| KR | 102546293 | B1 | * | 6/2023 | H10K 50/11 |
| KR | 102553139 | B1 | * | 7/2023 | H10K 77/111 |
| KR | 20230103658 | A | * | 7/2023 | H10K 59/8792 |
| TW | 202427151 | A | * | 7/2024 | G06F 3/0412 |
| TW | I872871 | B | * | 2/2025 | G06F 3/0412 |
| WO | 2019/223399 | A1 | | 11/2019 | |

OTHER PUBLICATIONS

Examination Report in United Kingdom Appln. No. GB2318282.7, mailed on May 20, 2025, 3 pages.
GB Combined Search and Examination Report issued on May 31, 2024 issued in Patent Application No. 2318282.7 (7 pages).

* cited by examiner

DISPLAY DEVICE

CROSS-REFERENCE TO RELATED APPLICATION

This application claims the priority of Korean Patent Application No. 10-2022-0183492 filed on Dec. 23, 2022, which is hereby incorporated by reference in its entirety.

BACKGROUND

Field of the Disclosure

The present disclosure relates to a display device, and more particularly, to a display device which reduces a touch noise in an area in which a camera or a sensor is disposed.

Description of the Background

As it enters the information era, a field of display device which visually expresses electrical information signals has been rapidly developed and studies are continuing to improve performances of various display devices, such as a thin profile, a light weight, and low power consumption.

A representative display device may include a liquid crystal display (LCD) device, a field emission display (FED) device, an electro-wetting display (EWD) device, an organic light emitting display (OLED) device, and the like.

An electroluminescent display device which is represented by an organic light emitting display device is a self-emitting display device so that a separate light source is not necessary, which is different from a liquid crystal display device. Therefore, the electroluminescent display device may be manufactured to have a light weight and a small thickness. Further, since the electroluminescent display device is advantageous not only in terms of power consumption due to the low voltage driving, but also in terms of color implementation, a response speed, a viewing angle, a contrast ratio (CR), it is expected to be utilized in various fields.

Recently, a multi-media function of a mobile terminal is being improved. For example, a camera or a sensor is basically embedded on a front surface of the display device. However, the camera or the sensor disposed on the front surface of the display device restricts a screen design to make the screen design difficult. To reduce a space occupied by the camera or the sensor on the front surface of the display device, a design including a notch or a punch hole is employed for the display device. However, the screen size is still restricted due to the camera or the sensor, so that it is difficult to implement a full-screen display.

To implement the full-screen display, a method for providing an area in which low-resolution pixels are disposed in the screen of the display device and disposing the camera and/or various sensors in an area in which the low-resolution pixels are disposed is being proposed.

SUMMARY

Accordingly, the present disclosure is directed to a display device that substantially achieves the desires described above.

More specifically, the present disclosure is to provide a display device which reduces a touch noise in an area in which the camera or the sensor is disposed to improve the touch performance.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings. The present disclosure is not limited to the above-mentioned and other features, which are not mentioned above, may be clearly understood by those skilled in the art from the following descriptions.

To achieve these and other advantages and in accordance with the present disclosure, as embodied and broadly described, a display device includes a substrate which includes a display area including a first optical area and a normal area and a non-display area; a planarization layer disposed on the substrate in the display area, a plurality of light emitting diodes which is disposed on the planarization layer and includes an anode, an emission layer, and a cathode; a bank which is disposed to cover an end of the anode on the planarization layer; an encapsulation unit which is disposed to cover the plurality of light emitting diodes and the bank; a touch sensing unit which is disposed on the encapsulation unit and includes a plurality of touch electrodes; and a plurality of shielding patterns which is disposed between the encapsulation unit and the plurality of touch electrodes in the first optical area. The first optical area includes a transmission area in which the cathode exposes the bank.

Other detailed matters of the exemplary aspects are included in the detailed description and the drawings.

According to the display device of the present disclosure, a camera or a sensor is disposed on a lower end of the light emitting diode or the touch electrode in the display area so that the display or the touch thereabove may not be disconnected.

In the display device of the present disclosure, in an area overlapping with the area in which the camera or the sensor is disposed, a transmission area in which an opaque component, such as an electrode formed of a metal, is not disposed is located. Therefore, the light transmittance in the area in which the camera or the sensor is disposed is improved to improve a luminosity factor of the display device.

In the display device of the present disclosure, a plurality of transmission areas and a plurality of shielding patterns are disposed to overlap with the plurality of touch electrodes at the boundary of the plurality of light emitting diodes to reduce a touch noise which may be generated in the display device through the transmission area TA.

In the display device of the present disclosure, an organic layer having a high flowability is disposed on a touch sensing unit to supplement a step caused by the touch sensing unit, thereby improving the visibility of the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
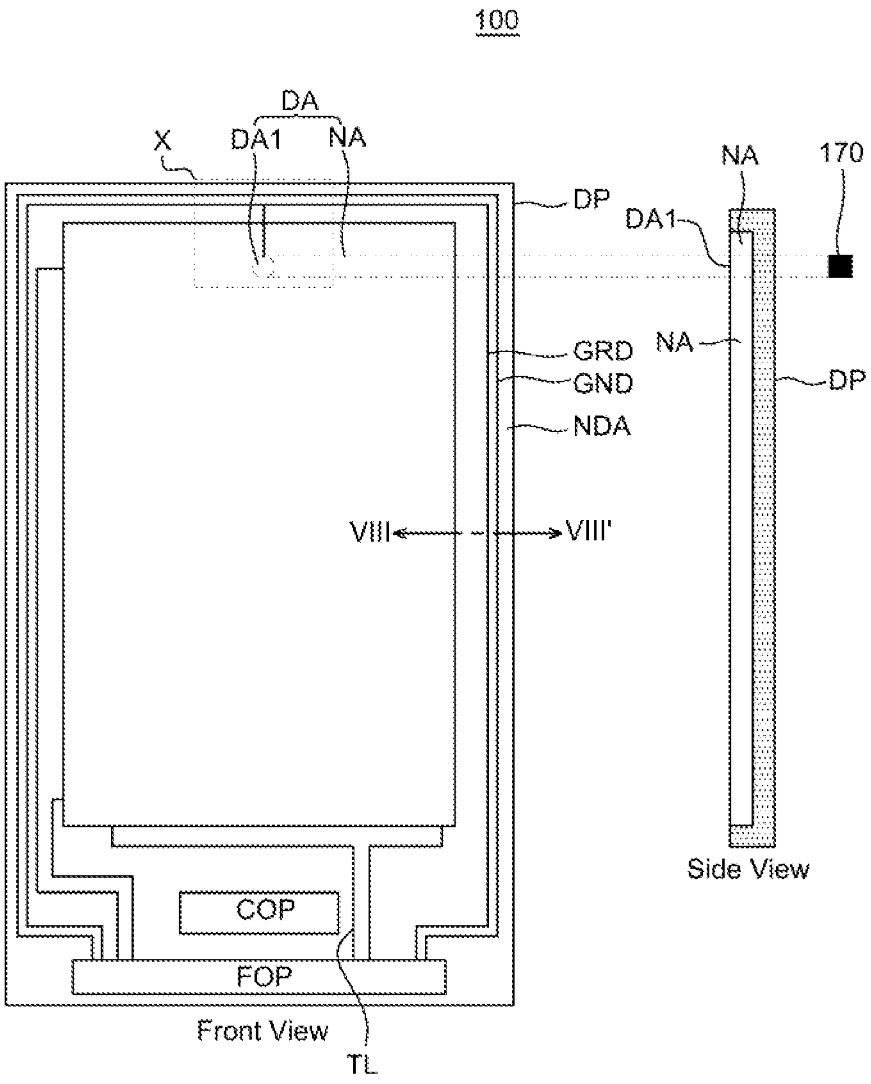
FIGS. 1A to 1D are schematic plan views of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, various exemplary aspects of the present disclosure will be described in detail with reference to the accompanying drawings.

FIGS. 1A to 1D are schematic plan views of a display device according to an exemplary aspect of the present disclosure;

Referring to FIGS. 1A to 1D, a display device 100 according to an exemplary aspect of the present disclosure may include a display panel DP which displays images and one or more optical electronic devices 170, 170*a*, and 170*b*. The optical electronic devices 170, 170*a*, and 170*b* may include a light receiving device which receives light, such as a camera or a sensor.

The display panel DP is a panel for displaying images to a user.

The display panel DP may include a display element which displays images, a driving element which drives the display element, and lines which transmit various signals to the display element and the driving element. The display element may be defined in different ways depending on a type of the display panel DP. For example, when the display panel DP is an organic light emitting display panel, the display element may be an organic light emitting diode which includes an anode, an emission layer, and a cathode. For example, when the display panel DP is a liquid crystal display panel, the display element may be a liquid crystal display element.

Hereinafter, even though the display panel DP is assumed as an organic light emitting display panel, the display panel DP is not limited to the organic light emitting display panel.

In the meantime, the display panel DP may be configured to include a substrate, a plurality of insulating layers, a transistor layer, and a light emitting diode layer on the substrate. The display panel DP may include a plurality of sub pixels for displaying images and various signal lines for driving the plurality of sub pixels. The signal lines may include a plurality of data lines, a plurality of gate lines, and a plurality of power lines. At this time, each of the plurality of sub pixels may include a transistor located on the transistor layer and a light emitting diode located on the light emitting diode layer.

The display panel DP may include a display area DA and a non-display area NDA.

The display area DA is an area where images are displayed in the display panel DP.

In the display area DA, a plurality of sub pixels which configures the plurality of pixels and a circuit for driving the plurality of sub pixels may be disposed. The plurality of sub pixels is minimum units which configure the display area DA and a display element may be disposed in each of the plurality of sub pixels. The plurality of sub pixels may configure a pixel. For example, an organic light emitting diode which includes an anode, an emission layer, and a cathode may be disposed in each of the plurality of sub pixels, but it is not limited thereto. Further, a circuit for driving the plurality of sub pixels may include a driving element, a line, and the like. For example, the circuit may be configured by a thin film transistor, a storage capacitor, a gate line, and a data line, but is not limited thereto.

The non-display area NDA is an area where no image is displayed.

The non-display area NDA may be bent so as not to be seen from a front surface or blocked by a case (not illustrated) and may be also referred to as a bezel area.

Even though in FIGS. 1A to 1D, it is illustrated that the non-display area NDA encloses a quadrangular display area DA, shapes and placements of the display area DA and the non-display area NDA are not limited to the example illustrated in FIGS. 1A to 1D. That is, the display area DA and the non-display area NDA may have shapes suitable for a design of an electronic device including the flexible display device 100. For example, an exemplary shape of the display area DA may be a pentagon, a hexagon, a circle, an oval, or the like.

In the non-display area NDA, various wiring lines and circuits for driving the organic light emitting diode of the display area DA may be disposed. For example, in the non-display area NDA, a link line which transmits signals to the plurality of sub pixels and circuits of the display area DA, a gate-in-panel (GIP) line, a ground line (GND, GRD), or a driving IC, such as a gate driver IC or a data driver IC, may be disposed, but it is not limited thereto.

For example, in the non-display area NDA, a ground line GND which is disposed to enclose the display area DA and applies a common voltage to the sub pixel may be included. For example, one or two or more ground lines GND may be formed. When two or more ground lines GND are formed, the ground line closer to the display area DA may be referred to as an internal ground line GRD.

Further, even though it is not illustrated, the display device 100 may include a touch sensing unit including a plurality of touch electrodes. In the plurality of touch electrodes, a touch routing line TL which transmits a touch signal may be disposed.

The display device 100 may further include various additional elements to generate various signals or drive the pixel in the display area DA. The additional elements for driving the pixels may include an inverter circuit, a multiplexer, an electrostatic discharge circuit (ESD), or the like. The display device 100 may further include an additional element associated with a function other than a function of driving a pixel. For example, the display device 100 may include additional elements which provide a touch sensing function, a user authentication function (for example, fingerprint recognition), a multilevel pressure sensing function, or a tactile feedback function. The above-mentioned additional elements may be located in an external circuit which is connected to the non-display area NDA and/or the connecting interface.

For example, in the non-display area NDA of the display device 100, a pad area PA may be included. In the pad area PA, pads which are connected to various signal lines or printed circuit boards are disposed. For example, in the non-display area NDA, a bending area may be further included between the display area DA and the pad area PA. The bending area is bent so that the pad area PA may be disposed on the rear surface of the display panel DP, but is not limited thereto.

The pad area PA may include an integrated circuit bonding pad area COP which is disposed in the non-display area NDA and is bonded with a driver integrated circuit DIC and a film bonding pad area FOP which is disposed in the non-display area NDA and is bonded with a flexible printed circuit. At this time, the integrated circuit bonding pad area COP may be located closer to the display area DA, than the film bonding pad area FOP.

Referring to FIGS. 1A to 1D, the display area DA may include a first optical area DA1 and a normal area NA, but is not limited thereto.

In FIGS. 1A to 1D, one or more optical electronic devices 170, 170*a*, and 170*b* are electronic components located below (in an opposite side of a viewing surface) of the display panel DP.

Light enters the front surface (viewing surface) of the display panel DP and passes through the display panel DP to be transmitted to one or more optical electronic devices 170, 170*a*, and 170*b* located below (an opposite side of a viewing surface) of the display panel DP.

One or more optical electronic devices 170, 170*a*, and 170*b* may be devices which receive light which passes through the display panel DP to perform a predetermined function according to the received light.

For example, the optical electronic devices 170, 170*a*, and 170*b* may include any one or more of cameras or proximity sensors.

As described above, the optical electronic devices 170, 170*a*, and 170*b* are devices which require light reception, but may be disposed below the display panel DP. That is, the optical electronic devices 170, 170*a*, and 170*b* may be disposed in an opposite side to a viewing surface of the display panel DP. The optical electronic devices 170, 170*a*, and 170*b* are not exposed to the front surface of the flexible display device 100. Accordingly, when a user views a front surface of the flexible display device 100, the optical electronic devices 170, 170*a*, and 170*b* are not seen.

For example, a camera which is located below the display panel DP is a front camera which captures the front surface and may also be considered as a camera lens.

The optical electronic devices 170, 170*a*, and 170*b* may be disposed to overlap with the display area DA of the display panel DP. That is, the optical electronic devices 170, 170*a*, and 170*b* may be disposed in the display area DA.

Referring to FIGS. 1A to 1D, the display area DA may include a normal area NA and one or more optical areas DA1 and DA2.

One or more optical areas DA1 and DA2 may be areas overlapping with one or more optical electronic devices 170, 170*a*, and 170*b*.

According to an example of FIG. 1A, the display area DA may include a normal area NA and a first optical area DA1.

Here, at least a part of the first optical area DA1 may overlap with a first optical electronic device 170.

Even though in FIG. 1A, a circular structure of the first optical area DA1 is illustrated, but a shape of the first optical area DA1 according to the exemplary aspect of the present disclosure is not limited thereto.

Figure 1B:
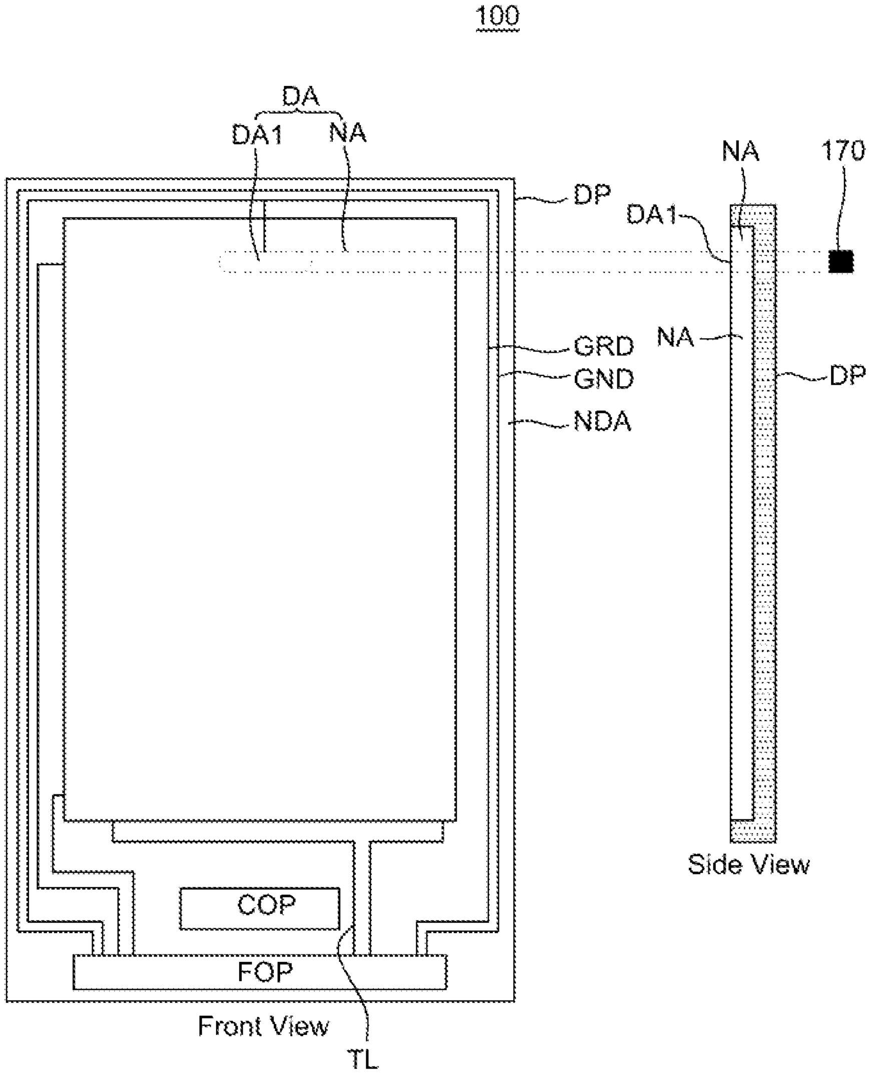

For example, as illustrated in FIG. 1B, the first optical area DA1 may have an octagonal shape, and also may be formed of various polygonal shapes.

Figure 1C:
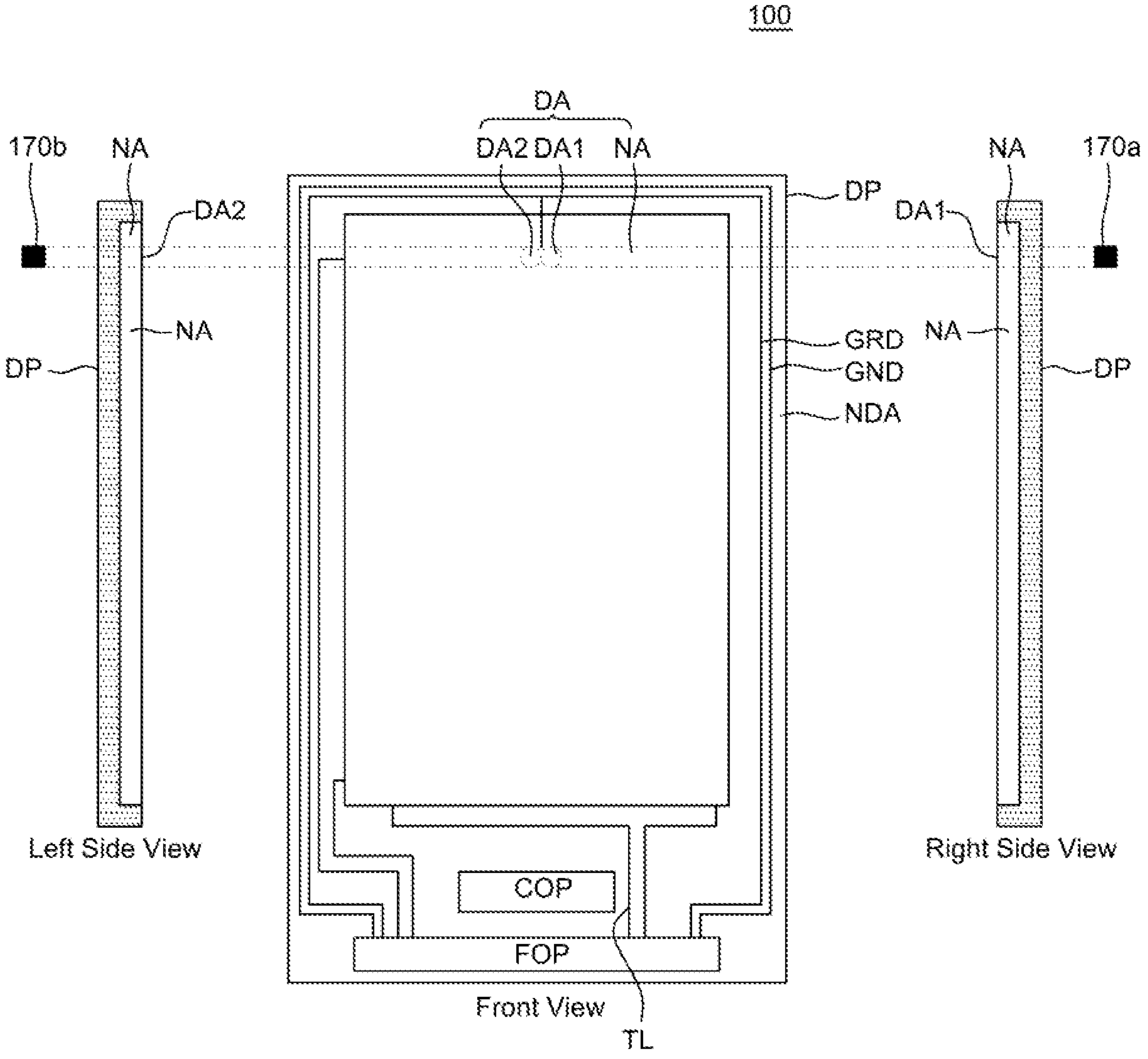

According to an example of FIG. 1C, the display area DA may include a normal area NA, a first optical area DA1, and a second optical area DA2. In an example of FIG. 1C, the normal area NA may be disposed between the first optical area DA1 and the second optical area DA2. Here, at least a part of the first optical area DA1 may overlap with the first optical electronic device 170*a* and at least a part of the second optical area DA2 may overlap with the second optical electronic device 170*b*.

Figure 1D:
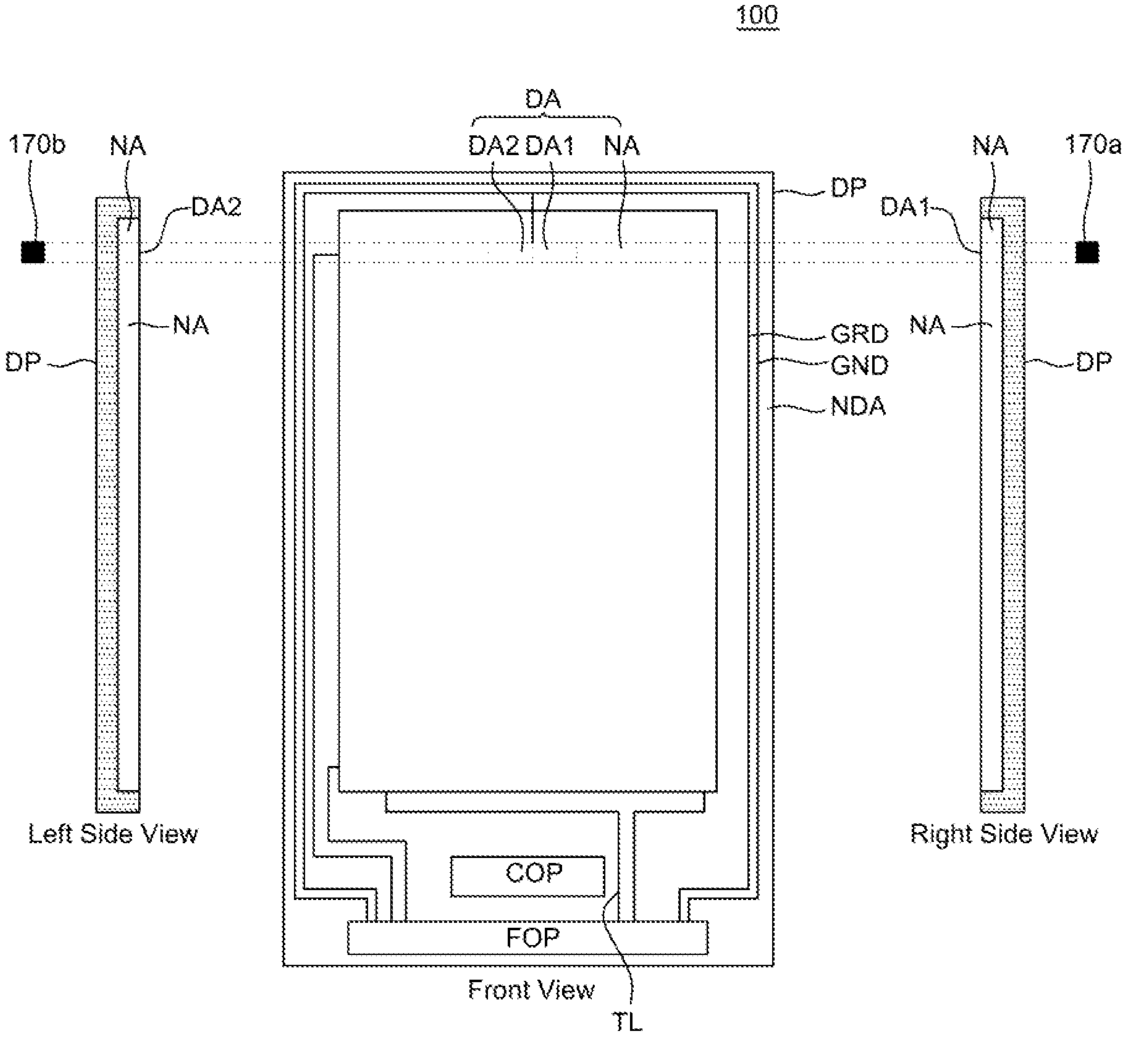

According to an example of FIG. 1D, the display area DA may include a normal area NA, a first optical area DA1, and a second optical area DA2. In an example of FIG. 1D, the normal area NA is not disposed between the first optical area DA1 and the second optical area DA2. That is, the first optical area DA1 and the second optical area DA2 may be in contact with each other. Here, at least a part of the first optical area DA1 may overlap with the first optical electronic device 170*a* and at least a part of the second optical area DA2 may overlap with the second optical electronic device 170*b*.

In one or more optical areas DA1 and DA2, both an image display structure and a light transmission structure need to be formed. That is, one or more optical areas DA1 and DA2 are a partial area of the display area DA so that in one or more optical areas DA1 and DA2, a sub pixel for displaying an image needs to be disposed. In one or more optical areas DA1 and DA2, a light transmission structure which transmits light to one or more optical electronic devices 170, 170*a*, and 170*b* needs to be formed.

One or more optical electronic devices 170, 170*a*, and 170*b* are devices which need to receive light, but are located behind the display panel DP (below, in an opposite side of a viewing surface) to receive light which passes through the display panel DP.

One or more optical electronic devices 170, 170*a*, and 170*b* are not exposed onto the front surface (the viewing surface) of the display panel DP. Accordingly, when a user views the front surface of the flexible display device 100, the optical electronic devices 170, 170*a*, and 170*b* are not seen to the user.

For example, the first optical electronic devices 170 and 170*a* may be cameras and the second optical electronic device 170*b* may be a sensing sensor such as a proximity sensor or an illumination sensor. For example, the sensing sensor may be an infrared sensor which senses an infrared ray.

In contrast, the first optical electronic devices 170 and 170*a* may be sensing sensors and the second electronic device 170*b* may be a camera.

Hereinafter, for the convenience of description, an example that the first optical electronic devices 170 and 170*a* are cameras and the second optical electronic device 170*b* is a sensing sensor will be described. Here, the camera may be a camera lens or an image sensor.

When the first optical electronic devices 170 and 170*a* are cameras, the camera may be a front side camera which is located behind (below) the display panel DP, but captures a front direction of the display panel DP. Accordingly, the user may take a picture through a camera which is not seen from the viewing surface while watching the viewing surface of the display panel DP.

The normal area NA and one or more optical areas DA1 and DA2 included in the display area DA are areas in which images may be displayed. The normal area NA is an area in which there is no need to form a light transmission structure and one or more optical areas DA1 and DA2 are areas in which the light transmission structure needs to be formed.

Accordingly, one or more optical areas DA1 and DA2 need to have a predetermined level or higher of transmittance and the normal area NA does not have light transmissivity or may have a transmittance lower than a predetermined level.

For example, one or more optical areas DA1 and DA2 and the normal area NA may have different resolutions, sub pixel placement structures, numbers of sub pixels for every unit area, electrode structures, line structures, electrode placement structures, line placement structures, or the like.

For example, the number of sub pixels for every unit area in one or more optical areas DA1 and DA2 may be smaller than the number of sub pixels for every unit area in the normal area NA. That is, the resolution of one or more optical areas DA1 and DA2 may be lower than a resolution of a normal area NA. At this time, the number of sub pixels for every unit area is a unit of measuring a resolution and may be also pixels per inch (PPI) indicating the number of pixels within one inch.

For example, the number of sub pixels for every unit area in the first optical area DA1 may be smaller than the number of sub pixels for every unit area in the normal area NA. The number of sub pixels for every unit area in the second optical area DA2 may be larger than the number of sub pixels for every unit area in the first optical area DA1.

For example, a resolution of the first optical area DA1 is less than 400 ppi, for example, 200 ppi to 324 ppi and a resolution of the normal area NA may be 400 ppi or higher.

The first optical area DA1 may have various shapes such as a circle, an oval, a rectangle, a hexagon, or an octagon. The second optical area DA2 may have various shapes such as a circle, an oval, a rectangle, a hexagon, or an octagon. The first optical area DA1 and the second optical area DA2 may have the same shape or different shapes.

Referring to FIG. 1C, when the first optical area DA1 and the second optical area DA2 are in contact with each other, the entire optical area including the first optical area DA1 and the second optical area DA2 may have various shapes, such as a circle, an oval, a rectangle, a hexagon, or an octagon.

Hereinafter, for the convenience of description, an example that the first optical area DA1 and the second optical area DA2 are circles will be described.

In the flexible display device 100 according to the exemplary aspect of the present disclosure, when the first optical electronic device 170 and 170*a* which are not exposed to the outside and are hidden below the display panel DP, the flexible display device 100 according to the exemplary aspect of the present disclosure may be said as a display to which an under display camera (UDC) technique is applied.

By doing this, in the flexible display device 100 according to the exemplary aspect of the present disclosure, there is no need to form a notch or a camera hole for exposing the camera in the display panel DP, so that the area of the display area DA is not reduced.

Accordingly, there is no need to form a notch or a camera hole for exposing the camera in the display panel DP so that a size of the bezel area is reduced and design constraints are not provided to increase a degree of freedom of design.

In the flexible display device 100 according to the exemplary aspect of the present disclosure, even though one or more optical electronic devices 170, 170*a*, and 170*b* are hidden behind the display panel DP, one or more optical electronic devices 170, 170*a*, and 170*b* need to normally receive the light to normally perform a determined function.

In the flexible display device 100 according to the exemplary aspect of the present disclosure, even though one or more optical electronic devices 170, 170*a*, and 170*b* are hidden behind the display panel DP and overlap with the display area DA, in one or more optical areas DA1 and DA2 overlapping with one or more optical electronic devices 170, 170*a*, and 170*b* in the display area DA, the image needs to be normally displayed.

Accordingly, the display device 100 according to the exemplary aspect of the present disclosure may have a structure which improves a transmittance of the first optical area DA1 and the second optical area DA2 overlapping with the optical electronic devices 170, 170*a*, and 170*b*.

Figure 2:
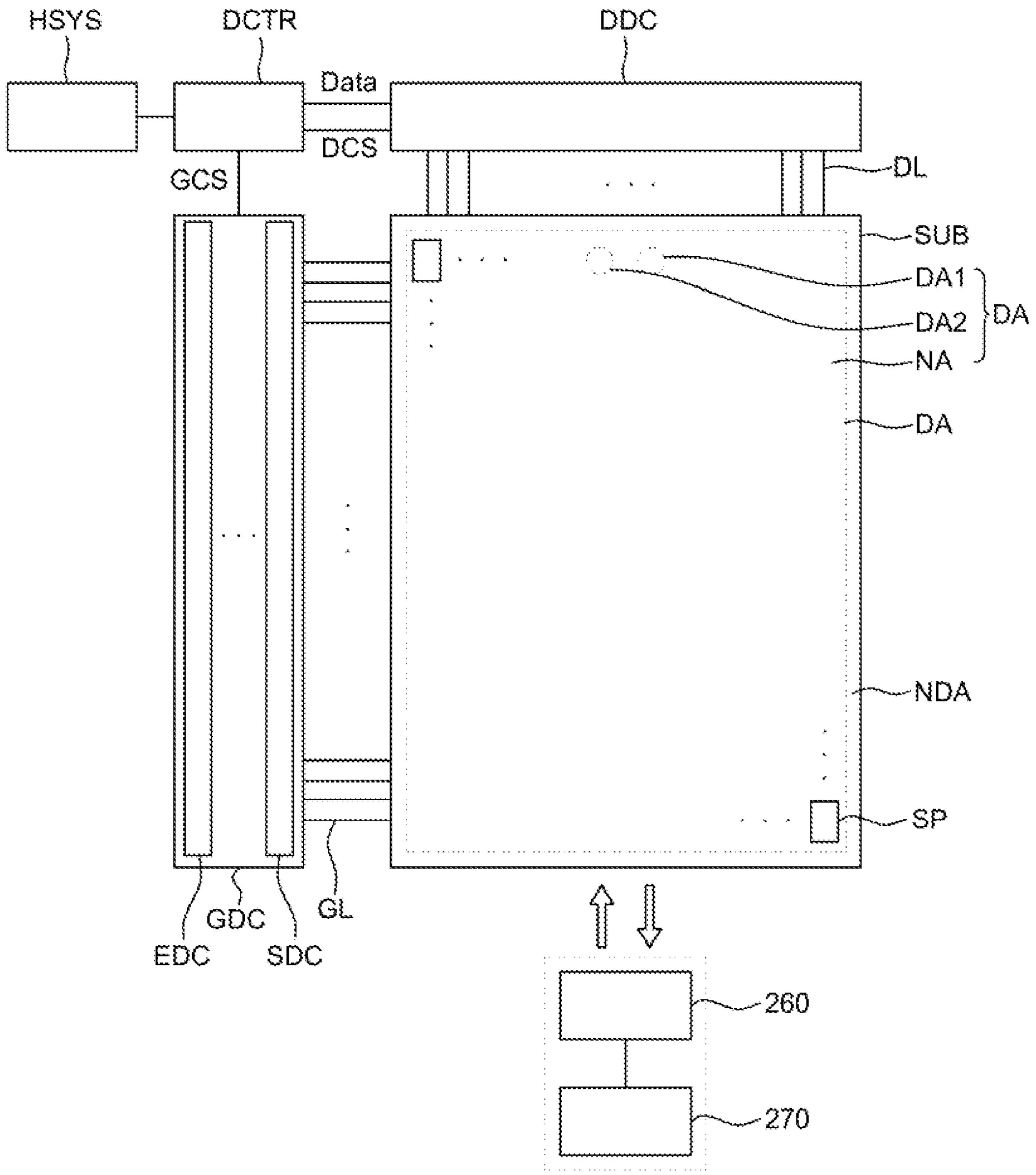
FIG. 2 is a system diagram of a display device according to an exemplary aspect of the present disclosure.

FIG. 2 is a system diagram of a display device according to an exemplary aspect of the present disclosure.

Referring to FIG. 2, the display device 100 may include a display panel DP and a display driving circuit, as components for displaying images.

The display driving circuit is a circuit for driving the display panel DP and may include a data driving circuit DDC, a gate driving circuit GDC, and a display controller DCTR.

The display panel DP may include a display area DA in which images are displayed and a non-display area NDA in which no image is displayed. The non-display area NDA may be an outer peripheral area of the display area DA and be also referred to as a bezel area. All or a part of the non-display area NDA may be an area which is visible from a front surface of the display device 100 or is bent so as not to be seen from the front surface of the display device 100.

The display panel DP may include a substrate SUB and a plurality of sub pixels SP disposed on the substrate SUB. Further, the display panel DP may further include various types of signal lines to drive the plurality of sub pixels SP.

The display device 100 according to the exemplary aspects of the present disclosure may be a liquid crystal display device or a self-emitting display device in which the display panel DP emits light by itself. When the display device 100 according to the exemplary aspects of the present disclosure is a self-emitting display device, each of a plurality of sub pixels SP may include a light emitting diode.

For example, the display device 100 according to the exemplary aspects of the present disclosure may be an organic light emitting display device in which the light emitting diode is implemented by an organic light emitting diode (OLED). As another example, the display devices 100 according to the exemplary aspects of the present disclosure may be an inorganic light emitting display device in which the light emitting diode is implemented by an inorganic material-based light emitting diode. As another example, the display device 100 according to the exemplary aspects of the present disclosure may be a quantum-dot display device in which the light emitting diode is implemented by a quantum dot which is a self-emitting semiconductor crystal.

Structures of the plurality of sub pixels SP may vary depending on a type of the display device 100. For example, when the display device 100 is a self-emitting display device in which the sub pixel SP emits by itself, each sub pixel SP may include a self-emitting element, one or more transistors, and one or more capacitors.

For example, various types of signal lines may include a plurality of data lines DL which transmits data signals (also referred to as data voltages or image signals) and a plurality of gate lines GL which transmits gate signals (also referred to as scan signals).

The plurality of data lines DL and the plurality of gate lines GL may intersect each other. Each of the plurality of data lines DL may be disposed to extend in a first direction. Each of the plurality of gate lines GL may be disposed to extend in a second direction.

Here, the first direction may be a column direction and the second direction may be a row direction. Alternatively, the first direction may be a row direction and the second direction may be a column direction.

The data driving circuit DDC is a circuit for driving a plurality of data lines DL and may output data signals to the plurality of data lines DL. The gate driving circuit GDC is a circuit for driving a plurality of gate lines GL and may output gate signals to the plurality of gate lines GL.

The display controller DCTR is a device for controlling a data driving circuit DDC and a gate driving circuit GDC and may control a driving timing for the plurality of data lines DL and a driving timing for the plurality of gate lines GL.

The display controller DCTR may supply a data driving control signal DCS for controlling the data driving circuit DDC to the data driving circuit DDC and supply a gate driving control signal GCS for controlling the gate driving circuit GDC to the gate driving circuit GDC.

The display controller DCTR receives input image data from a host system HSYS to supply image data Data to the data driving circuit DDC based on the input image data.

The data driving circuit DDC may supply data signals to the plurality of data lines DL according to the driving timing control of the display controller DCTR.

The data driving circuit DDC may receive digital image data Data from the display controller DCTR and convert the received image data Data into analog data signals to output the converted data signals to the plurality of data lines DL.

The gate driving circuit GDC may supply gate signals to the plurality of gate lines GL according to the driving timing control of the display controller DCTR. The gate driving circuit GDC is supplied with a first gate voltage corresponding to a turn-on level voltage and a second gate voltage corresponding to a turn-off level voltage together with various gate driving control signals GCS to generate gate signals and may supply the generated gate signals to the plurality of gate lines GL.

The gate driving circuit GDC supplies the gate signals to the gate lines GL in accordance with the gate driving control signal GCS supplied from the display controller DCTR. The gate driving circuit GDC may be disposed in one side or both sides of the display panel DP in a gate in panel (GIP) manner.

The gate driving circuit GDC sequentially outputs the gate signals to the plurality of gate lines GL under the control of the display controller DCTR. The gate driving circuit GDC shifts the gate signal using a shift register to sequentially supply the signals to the gate lines GL.

The gate signal may include a scan signal SC and an emission control signal EM in the organic light emitting display device. The scan signal SC includes a scan signal pulse swinging between a first gate voltage and a second gate voltage. The emission control signal EM may include an emission control signal pulse swinging between a third gate voltage and a fourth gate voltage.

The scan pulse is synchronized with the data voltage Vdata to select sub pixels SP of a line in which the data is written. The emission control signal EM defines an emission time of each of the sub pixels SP.

The gate driving circuit GDC may include an emission control signal driver EDC which outputs an emission control signal EM and at least one scan driver SDC which outputs a scan signal SC.

The emission control signal driver EDC outputs an emission control signal EM in response to a start pulse and a shift clock from the display controller DCTR and sequentially shifts the emission control signal pulse in accordance with a shift clock.

At least one scan driver SDC outputs the scan signal SC in response to a start pulse and a shift clock from the display controller DCTR and shifts a scan signal pulse in accordance with the shift clock timing.

In the gate driving circuit GDC which is disposed in a GIP manner, shift registers may be symmetrically disposed on both sides of the display area DA. Further, the gate driving circuit GDC may be configured such that a shift register at one side of the display area DA includes at least one scan driver SDC and an emission control signal driver and a shift register at the other side of the display area DA may include at least one scan driver SDC. However, it is not limited thereto and the emission control signal driver EDC and at least one scan driver SDC may be disposed in different ways according to the exemplary aspects.

The data driving circuit DDC may be connected to the display panel DP in a tape automated bonding (TAB) manner or connected to a bonding pad of the display panel DP in a chip on glass (COG) or a chip on panel (COP) manner, or may be implemented in a chip on film (COF) manner to be connected to the display panel DP.

The gate driving circuit GDC may be connected to the display panel DP in a tape automated bonding (TAB) manner or connected to a bonding pad of the display panel DP in a chip on glass (COG) or a chip on panel (COP) manner, or may be implemented in a chip on film (COF) manner to be connected to the display panel DP. Alternatively, the gate driving circuit GDC may be formed in a non-display area NDA of the display panel DP as a gate in panel (GIP) type. The gate driving circuit GDC may be disposed on the substrate or may be connected to the substrate. That is, when the gate driving circuit GDC is a GIP type, the gate driving circuit may be disposed in the non-display area NDA of the substrate. When the gate driving circuit GDC is a chip-on glass (COG) type or a chip-on film (COF) type, the gate driving circuit may be connected to the substrate.

In the meantime, at least one of the data driving circuit DDC and the gate driving circuit GDC may be disposed in the display area DA of the display panel DP. For example, at least one of the data driving circuit DDC and the gate driving circuit GDC may be disposed so as not to overlap with the sub pixels SP or disposed to partially or entirely overlap with the sub pixels SP.

The data driving circuit DDC may be connected to one side (for example, an upper side or a lower side) of the display panel DP. Depending on a driving method or a panel design method, the data driving circuit DDC may be connected to both sides (for example, the upper side and the lower side) of the display panel DP or connected to two or more sides of four side surfaces of the display panel DP.

The gate driving circuit GDC may be connected to one side (for example, a left side or a right side) of the display panel DP. Depending on a driving method or a panel design method, the gate driving circuit GDC may be connected to both sides (for example, the left side and the right side) of the display panel DP or connected to two or more sides of four side surfaces of the display panel DP.

The display controller DCTR may be implemented as a component separated from the data driving circuit DDC or may be integrated with the data driving circuit DDC to be implemented as an integrated circuit.

The display controller DCTR may be a timing controller which is used in a general display technique or a control device which includes a timing controller to further perform other control functions, or a control device which is different from the timing controller, or a circuit in the control device. The display controller DCTR may be implemented by various circuits or electronic components, such as an integrated circuit (IC), a field programmable gate array (FPGA), an application specific integrated circuit (ASIC), or a processor.

The display controller DCTR is mounted in a printed circuit board, a flexible printed circuit, and the like and may be electrically connected to the data driving circuit DDC and the gate driving circuit GDC through the printed circuit board, the flexible printed circuit, or the like.

The display controller DCTR may transmit and receive a signal with the data driving circuit DDC in accordance with one or more predetermined interfaces. Here, for example, the interface may include a low voltage differential signaling (LVDS) interface, an embedded clock point-to-point interface (EPI), a serial peripheral interface (SPI), or the like.

The display device 100 according to the exemplary aspects of the present disclosure may include a touch sensor and a touch sensing circuit to further provide not only an image displaying function but also a touch sensing function. The touch sensing circuit senses the touch sensor to detect whether a touch occurs by a touch object, such as a finger or a pen or detect a touched position.

The touch sensing circuit may further include a touch driving circuit 260 which drives and senses the touch sensor to generate and output touch sensing data, a touch controller 270 which senses the touch generation or detects the touched position using the touch sensing data, and the like.

The touch sensor may include a plurality of touch electrodes. The touch sensor may further include a plurality of touch lines which electrically connects the plurality of touch electrodes and the touch driving circuit 260.

The touch sensor may be provided at the outside of the display panel DP as a touch panel type or provided in the display panel DP. When the touch sensor is provided at the outside of the display panel DP as a touch panel type, the touch sensor is referred to as an external type. When the touch sensor is an external type, the touch panel and the display panel DP are separately manufactured to be combined during an assembling process. The external type touch panel may include a substrate for a touch panel, a plurality of touch electrodes on the substrate for a touch panel, and the like.

When the touch sensor is provided in the display panel DP, a touch sensor may be formed on the substrate SUB together with signal lines and electrodes related to the display driving, during the process of manufacturing the display panel DP.

The touch driving circuit 260 may supply a touch driving signal to at least one of the plurality of touch electrodes and sense at least one of the plurality of touch electrodes to generate touch sensing data.

The touch sensing circuit may perform touch sensing in the self-capacitance sensing manner or a mutual-capacitance sensing manner.

When the touch sensing circuit performs the touch sensing in the self-capacitance sensing manner, the touch sensing circuit may perform the touch sensing based on capacitance between each touch electrode and a touch object (for example, a finger or a pen).

According to the self-capacitance sensing manner, each of the plurality of touch electrodes may serve as a driving touch electrode and also serve as a sensing touch electrode. The touch driving circuit 260 may drive all or some of the plurality of touch electrodes and sense all or some of the plurality of touch electrodes.

When the touch sensing circuit performs the touch sensing in the mutual-capacitance sensing manner, the touch sensing circuit may perform the touch sensing based on the capacitance between touch electrodes.

According to the mutual-capacitance sensing manner, the plurality of touch electrodes is divided into driving touch electrodes and sensing touch electrodes. The touch driving circuit 260 may drive the driving touch electrodes and sense the sensing touch electrodes.

The touch driving circuit 260 and the touch controller 270 included in the touch sensing circuit may be implemented as separate devices or implemented as one device. Further, the touch driving circuit 260 and the data driving circuit DDC may be implemented as separate devices or implemented as one device.

The display device 100 may further include a power supply circuit which supplies various powers to the display driving circuit and/or the touch sensing circuit.

The display device 100 according to the exemplary aspects of the present disclosure may be mobile terminals such as smart phones or tablets or may be monitors or television TV with various sizes, but is not limited thereto and may be a display device of various types or various sizes which express information or images.

As described above, in the display panel DP, the display area DA may include a normal area NA and one or more optical areas DA1 and DA2.

The normal area NA and one or more optical area DA1 and DA2 are areas which are capable of displaying images. However, the normal area NA is an area in which there is no need to form a light transmission structure and one or more optical areas DA1 and DA2 are areas in which the light transmission structure needs to be formed.

As described above, in the display panel DP, the display area DA may include one or more optical areas DA1 and DA2 together with the normal area NA, but for the convenience of description, it is also assumed that the display area DA includes both the first optical area DA1 and the second optical area DA2 (FIGS. 1B and 1C).

Figure 3:
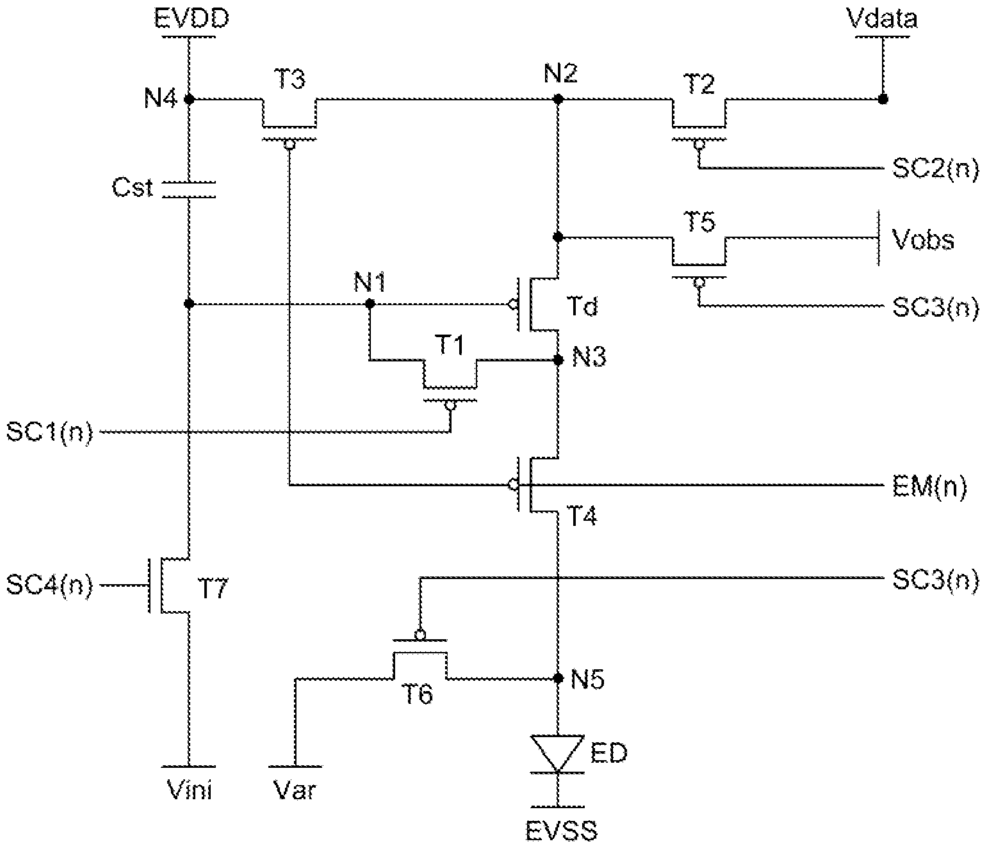
FIG. 3 is an equivalent circuit diagram of a sub pixel in a display panel according to an exemplary aspect of the present disclosure.

FIG. 3 is an equivalent circuit diagram of a sub pixel in a display panel according to an exemplary aspect of the present disclosure.

FIG. 3 exemplarily illustrates the pixel circuit for description and it is not specifically limited as long as the structure may control the emission of the light emitting diode (ED) 120 by applying the emission control signal EM(n). For example, the pixel circuit may include an additional scan signal, a switching thin film transistor connected thereto, and a switching thin film transistor to which an additional initialization voltage is applied. Further, a connection relationship of a switching element or a connection location of a capacitor may be disposed in various manners. Hereinafter, for the convenience of description, a display device with a pixel circuit structure of FIG. 3 will be described.

Referring to FIG. 3, each of the plurality of sub pixels SP may include a pixel circuit having a driving transistor Td and a light emitting diode (ED) 120 connected to the pixel circuit.

Each of the sub pixels SP disposed in the normal area NA, the first optical area DA1, and the second optical area DA2 included in the display area DA of the display panel DP may include a light emitting diode (ED) 120, a driving transistor Td, a plurality of scan transistors T1 to T7, and a capacitor Cst. The driving transistor Td drives the light emitting diode (ED) 120, the plurality of scan transistors T1 to T7 operates the driving transistor Td, and the capacitor Cst maintains a predetermined voltage for one frame.

The pixel circuit controls the driving current which flows in the light emitting diode (ED) 120 to drive the light emitting diode (ED) 120. The pixel circuit may include the driving transistor Td, the first to seventh transistors T1 to T7, and the capacitor Cst. Each of the transistors Td, T1 to T7 may include a first electrode, a second electrode, and a gate electrode. One of the first electrode and the second electrode may be a source electrode and the other one of the first electrode and the second electrode may be a drain electrode.

Each of the transistors Td, T1 to T7 may be a P-type thin film transistor or an N-type thin film transistor. In the exemplary aspect of FIG. 3, the first transistor T1 and the seventh transistor T7 are N-type thin film transistors and the remaining transistors Td, T2 to T6 are P-type thin film transistors. However, it is not limited thereto and depending on the exemplary aspect, all or some of the transistors Td, T1 to T7 may be P-type thin film transistors or N-type thin film transistors. Further, the N-type thin film transistor may be an oxide thin film transistor and the P-type thin film transistor may be a polycrystalline silicon thin film transistor.

Hereinafter, it is exemplified that the first transistor T1 and the seventh transistor T7 are N-type thin film transistors and the remaining transistors Td, T2 to T6 are P-type thin film transistors. Accordingly, a high voltage is applied to the first transistor T1 and the seventh transistor T7 to be turned on and a low voltage is applied to the remaining transistors Td, T2 to T6 to be turned on.

According to the exemplary aspect, the first transistor T1 which configures the pixel circuit may serve as a compensation transistor, the second transistor T2 may serve as a data supplying transistor, the third and fourth transistors T3 and T4 may serve as emission control transistors, and the fifth transistor T5 may serve as a bias transistor. Further, the sixth and seventh transistors T6 and T7 may serve as initialization transistors.

The light emitting diode (ED) 120 may include an anode electrode and a cathode electrode. The anode electrode of the light emitting diode (ED) 120 may be connected to a fifth node N5 and the cathode may be connected to a low potential driving voltage EVSS.

The driving transistor Td may include a first electrode connected to a second node N2, a second electrode connected to a third node N3, and a gate electrode connected to a first node N1. The driving transistor Td may provide a driving current Id to the light emitting diode (ED) 120 based on a voltage of the first node N1 (or a data voltage stored in the capacitor Cst to be described below).

The first transistor T1 may include a first electrode connected to the first node N1, a second electrode connected to the third node N3, and a gate electrode which receives a first scan signal SC1(*n*). The first transistor T1 is turned on in response to the first scan signal SC1(*n*) and is diode-connected between the first node N1 and the third node N3 to sample a threshold voltage Vth of the driving transistor Td. Such a first transistor T1 may be a compensation transistor.

The capacitor Cst may be connected or formed between the first node N1 and a fourth node N4. The capacitor Cst may store or maintain the supplied high potential driving voltage EVDD. In some cases, as the capacitor Cst, one or more capacitors may be further included.

The second transistor T2 may include a first electrode which is connected to a data line DL (or receives a data voltage Vdata), a second electrode connected to the second node N2, and a gate electrode which receives a second scan signal SC2(*n*). The second transistor T2 may be turned on in response to a second scan signal SC2(*n*) and transmit the data voltage Vdata to the second node N2. Such a second transistor T2 may be a data supply transistor.

The third transistor T3 and the fourth transistor T4 (or first and second emission control transistors) may be connected between the high potential driving voltage EVDD and the light emitting diode (ED) 120 and form a current movement path through which the driving current Id generated by the driving transistor Td moves.

The third transistor T3 may include a first electrode which is connected to the fourth node N4 to receive a high potential driving voltage EVDD, a second electrode connected to the second node N2, and a gate electrode which receives an emission control signal EM(n).

The fourth transistor T4 may include a first electrode connected to the third node N3, a second electrode connected to the fifth node N5 (or the anode electrode of the light emitting diode (ED) 120), and a gate electrode which receives the emission control signal EM(n).

The third and fourth transistors T3 and T4 are turned on in response to the emission control signal EM(n) and in this case, the driving current Id is supplied to the light emitting diode (ED) 120 and the light emitting diode (ED) 120 may emit light with a luminance corresponding to the driving current Id.

The fifth transistor T5 may include a first electrode which receives a bias voltage Vobs, a second electrode connected to the second node N2, and a gate electrode which receives a third scan signal SC3(*n*). Such a fifth transistor T5 may be a bias transistor.

The sixth transistor T6 may include a first electrode which receives a first initialization voltage Var, a second electrode connected to the fifth node N5, and a gate electrode which receives the third scan signal SC3(*n*).

The sixth transistor T6 is turned on in response to the third scan signal SC3(*n*), before the light emitting diode (ED) 120 emits light (or after the light emitting diode (ED) 120 emits light) and may initialize the anode electrode (or the pixel electrode) of the light emitting diode (ED) 120 using the first initialization voltage Var. The light emitting diode (ED) 120 may have a parasitic capacitor formed between the anode electrode and the cathode electrode. The parasitic capacitor is charged while the light emitting diode (ED) 120 emits light so that the anode electrode of the light emitting diode (ED) 120 may have a specific voltage. Accordingly, the first initialization voltage Var is applied to the anode electrode of the light emitting diode (ED) 120 through the sixth transistor T6 to initialize a quantity of charges accumulated in the light emitting diode (ED) 120.

In the present specification, the gate electrodes of the fifth and sixth transistors T5 and T6 are configured to commonly receive the third scan signal SC3(*n*). However, the present specification is not essentially limited thereto and the gate electrodes of the fifth and sixth transistors T5 and T6 may be configured to receive separate scan signals to be independently controlled.

The seventh transistor T7 may include a first electrode which receives a second initialization voltage Vini, a second electrode connected to the first node N1, and a gate electrode which receives a fourth scan signal SC4(*n*).

The seventh transistor T7 is turned on in response to the fourth scan signal SC4(*n*) and may initialize the gate electrode of the driving transistor Td using the second initialization voltage Vini. In the gate electrode of the driving transistor Td, unnecessary charges may remain due to the high potential driving voltage EVDD stored in the capacitor Cst. Accordingly, the second initialization voltage Vini is applied to the gate electrode of the driving transistor Td through the seventh transistor T7 to initialize the remaining quantity of charges.

In the meantime, as one method for increasing a transmittance of at least one of the first optical area DA1 and the second optical area DA2, a pixel density differential design method may be applied as described above. According to the pixel density differential design method, the display panel DP may be designed such that the number of sub pixels per unit area of at least one of the first optical area DA1 and the second optical area DA2 is smaller than the number of sub pixels per unit area of the normal area NA.

In the meantime, in some cases, in contrast, as another method for increasing a transmittance of at least one of the first optical area DA1 and the second optical area DA2, a pixel size differential design method may be applied. According to the pixel size differential design method, the display panel DP may be designed such that the number of sub pixels per unit area of at least one of the first optical area DA1 and the second optical area DA2 is equal to or similar to the number of sub pixels per unit area of the normal area NA. However, the size (that is, an emission area size) of each sub pixel SP disposed in at least one of the first optical area DA1 and the second optical area DA2 is smaller than the size (that is, an emission area size) of each sub pixel SP disposed in the normal area NA.

Hereinafter, for the convenience of description, it is assumed that the pixel density differential design method, between two methods (the pixel density differential design method and the pixel size differential design method) for increasing a transmittance of at least one of the first optical area DA1 and the second optical area DA2, is applied.

Figure 4:
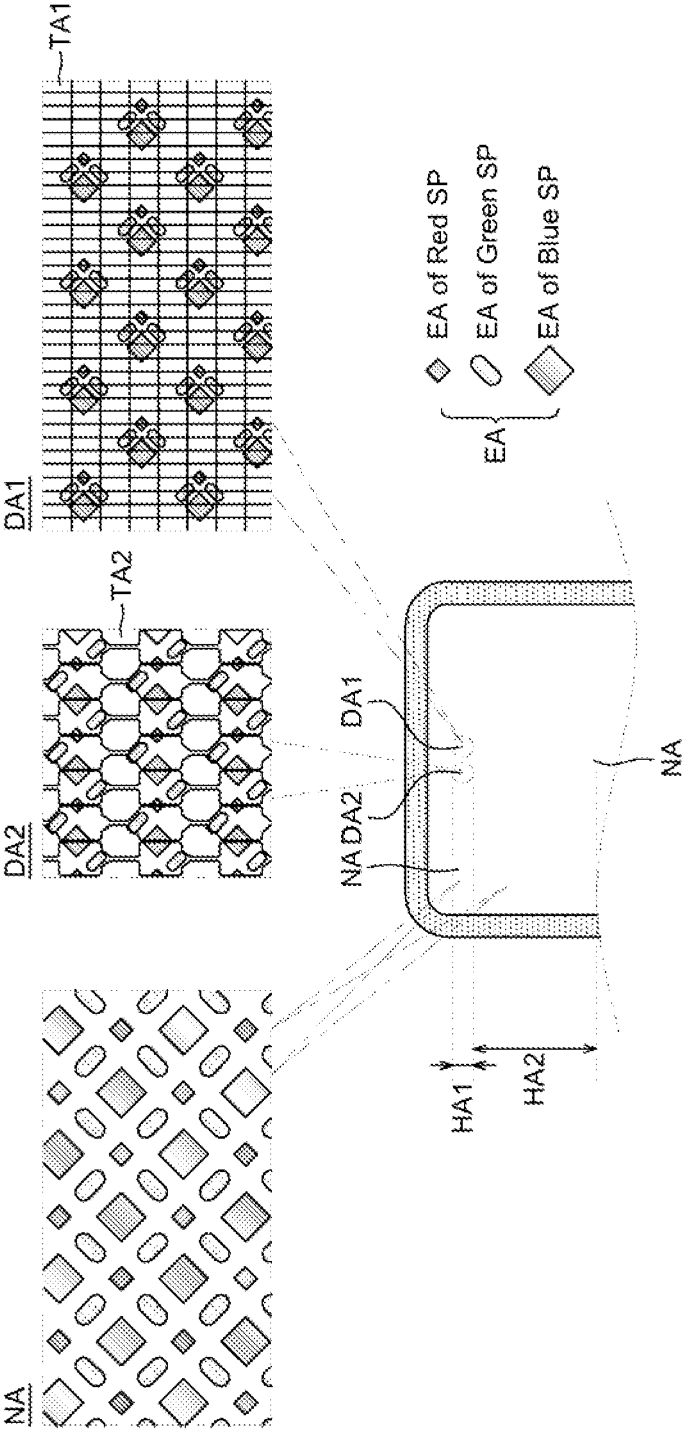
FIG. 4 is a view illustrating a placement of a sub pixel of a display area in a display panel according to an exemplary aspect of the present disclosure.

FIG. 4 is a view illustrating a placement of a sub pixel of a display area in a display panel according to an exemplary aspect of the present disclosure.

That is, FIG. 4 illustrates the placement of the sub pixels SP in three areas NA, DA1, and DA2 included in the display area of the display panel according to the exemplary aspect of the present disclosure.

Referring to FIG. 4, in each of the normal area NA, the first optical area DA1, and the second optical area DA2 included in the display area, a plurality of sub pixels SP may be disposed.

For example, the plurality of sub pixels SP may include a red sub pixel Red SP which emits red light, a green sub pixel Green SP which emits green light, and a blue sub pixel Blue SP which emits blue light.

Therefore, each of the normal area NA, the first optical area DA1, and the second optical area DA2 may include an emission area EA of the red sub pixel Red SP, an emission area EA of the green sub pixel Green SP, and an emission area EA of the blue sub pixel Blue SP.

Referring to FIG. 4, the normal area NA does not include a light transmission structure, but may include an emission area EA.

However, the first optical area DA1 and the second optical area DA2 need to include not only the emission area EA, but also the light transmission structure.

Accordingly, the first optical area DA1 may include the emission area EA and a first transmission area TA1 and the second optical area DA2 may include the emission area EA and a second transmission area TA2.

The emission area EA and the transmission areas TA1 and TA2 may be distinguished depending on whether to transmit light. That is, the emission area EA may be an area through which the light cannot be transmitted and the transmission areas TA1 and TA2 may be an area through which the light may be transmitted.

Further, the emission area EA and the transmission areas TA1 and TA2 may be distinguished depending on whether to form a specific metal layer. For example, in the emission area EA, the cathode electrode may be formed and in the transmission areas TA1 and TA2, the cathode electrode may not be formed. Further, in the emission area EA, a light shielding layer may be formed and in the transmission areas TA1 and TA2, the light shielding layer may not be formed.

At this time, the first optical area DA1 includes a first transmission area TA1 and the second optical area DA2 includes a second transmission area TA2 so that both the first optical area DA1 and the second optical area DA2 are areas through which light may pass.

At this time, a transmittance (degree of transmission) of the first optical area DA1 and a transmittance (a degree of transmission) of the second optical area DA2 may be equal.

In this case, the first transmission area TA1 of the first optical area DA1 and the second transmission area TA2 of the second optical area DA2 may have the same shape or same size. Alternatively, even though the first transmission area TA1 of the first optical area DA1 and the second transmission area TA2 of the second optical area DA2 have different shapes or sizes, a rate of the first transmission area TA1 in the first optical area DA1 and a rate of the second transmission area TA2 in the second optical area DA2 may be equal.

In contrast, a transmittance (a degree of transmission) of the first optical area DA1 and a transmittance (a degree of transmission) of the second optical area DA2 may be different from each other.

In this case, the first transmission area TA1 of the first optical area DA1 and the second transmission area TA2 of the second optical area DA2 may have different shapes or sizes. Alternatively, even though the first transmission area TA1 of the first optical area DA1 and the second transmission area TA2 of the second optical area DA2 have the same shape or size, a rate of the first transmission area TA1 in the first optical area DA1 and a rate of the second transmission area TA2 in the second optical area DA2 may be different.

For example, when the first optical electronic device which overlaps with the first optical area DA1 is a camera and the second optical electronic device which overlaps with the second optical area DA2 is a sensing sensor, the camera may require more amount of light than the sensing sensor.

Accordingly, the transmittance (a degree of transmission) of the first optical area DA1 may be higher than the transmittance (a degree of transmission) of the second optical area DA2.

In this case, the size of the first transmission area TA1 of the first optical area DA1 may be larger than the size of the second transmission area TA2 of the second optical area DA2. Alternatively, even though the first transmission area TA1 of the first optical area DA1 and the second transmission area TA2 of the second optical area DA2 have the same shape or size, a rate of the first transmission area TA1 in the first optical area DA1 may be higher than a rate of the second transmission area TA2 in the second optical area DA2.

Hereinafter, for the convenience of description, an example that the transmittance (a degree of transmission) of the first optical area DA1 is higher than the transmittance (a degree of transmission) of the second optical area DA2 will be described.

Further, as illustrated in FIG. 4, in the exemplary aspect of the present disclosure, the transmission areas TA1 and TA2 may also be referred to as transparent areas and the transmittance may also be referred to as a transparency.

Further, as illustrated in FIG. 4, in the exemplary aspect of the present disclosure, it is assumed that the first optical area DA1 and the second optical area DA2 are located in an upper portion of the display area of the display panel and are horizontally parallel to each other.

Referring to FIG. 4, a horizontal display area in which the first optical area DA1 and the second optical area DA2 are disposed is referred to as a first horizontal display area HA1. Further, a horizontal display area in which the first optical area DA1 and the second optical area DA2 are not disposed is referred to as a second horizontal display area HA2.

Referring to FIG. 4, the first horizontal display area HA1 may include the normal area NA, the first optical area DA1, and the second optical area DA2. In contrast, the second horizontal display area HA2 may include only the normal area NA.

Figure 5A:
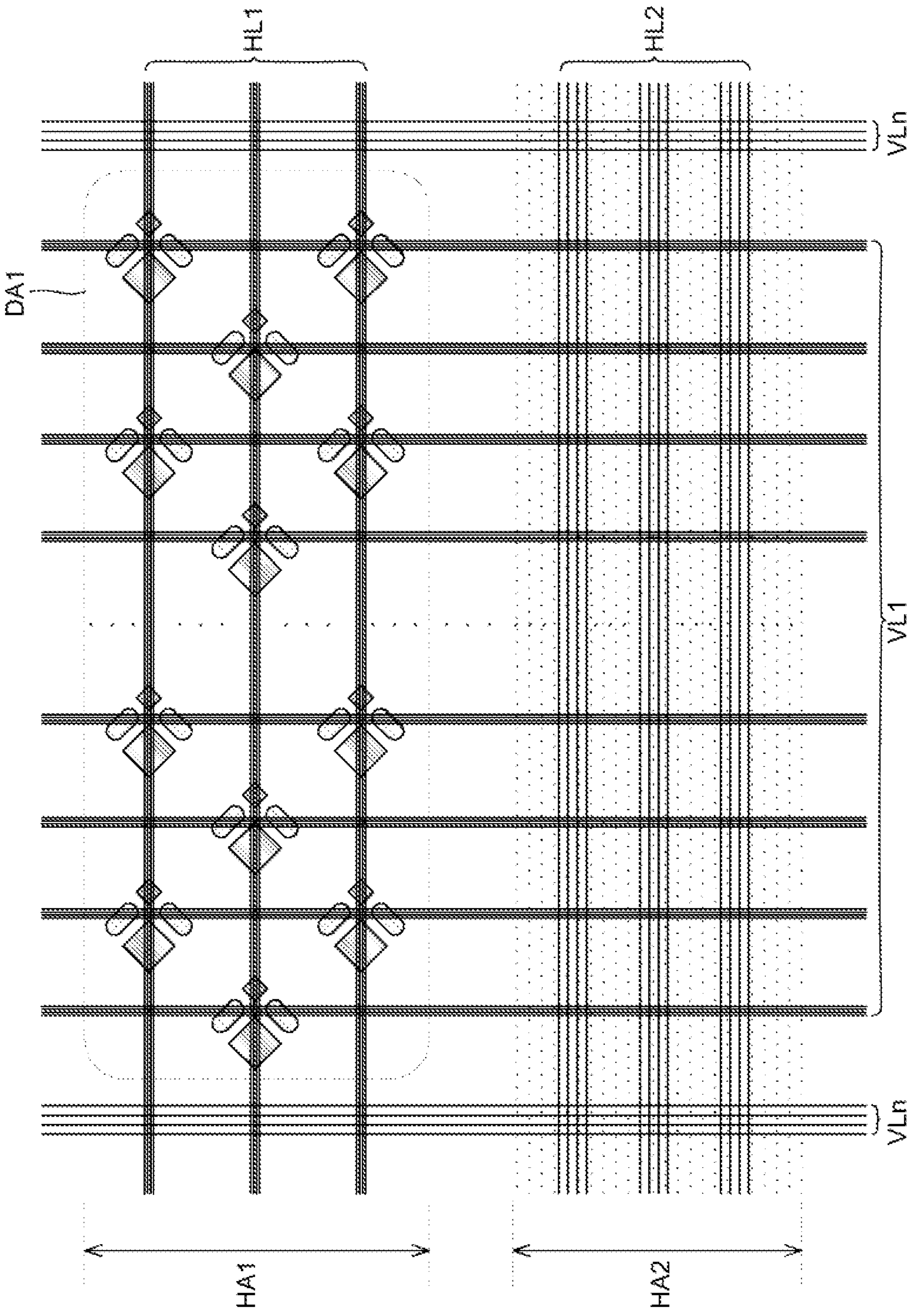
FIG. 5A is a view exemplarily illustrating a placement of a signal line in a first optical area and a normal area in a display panel according to an exemplary aspect of the present disclosure.

FIG. 5A is a view exemplarily illustrating a placement of a signal line in each of a first optical area and a normal area in a display panel according to an exemplary aspect of the present disclosure.

Figure 5B:
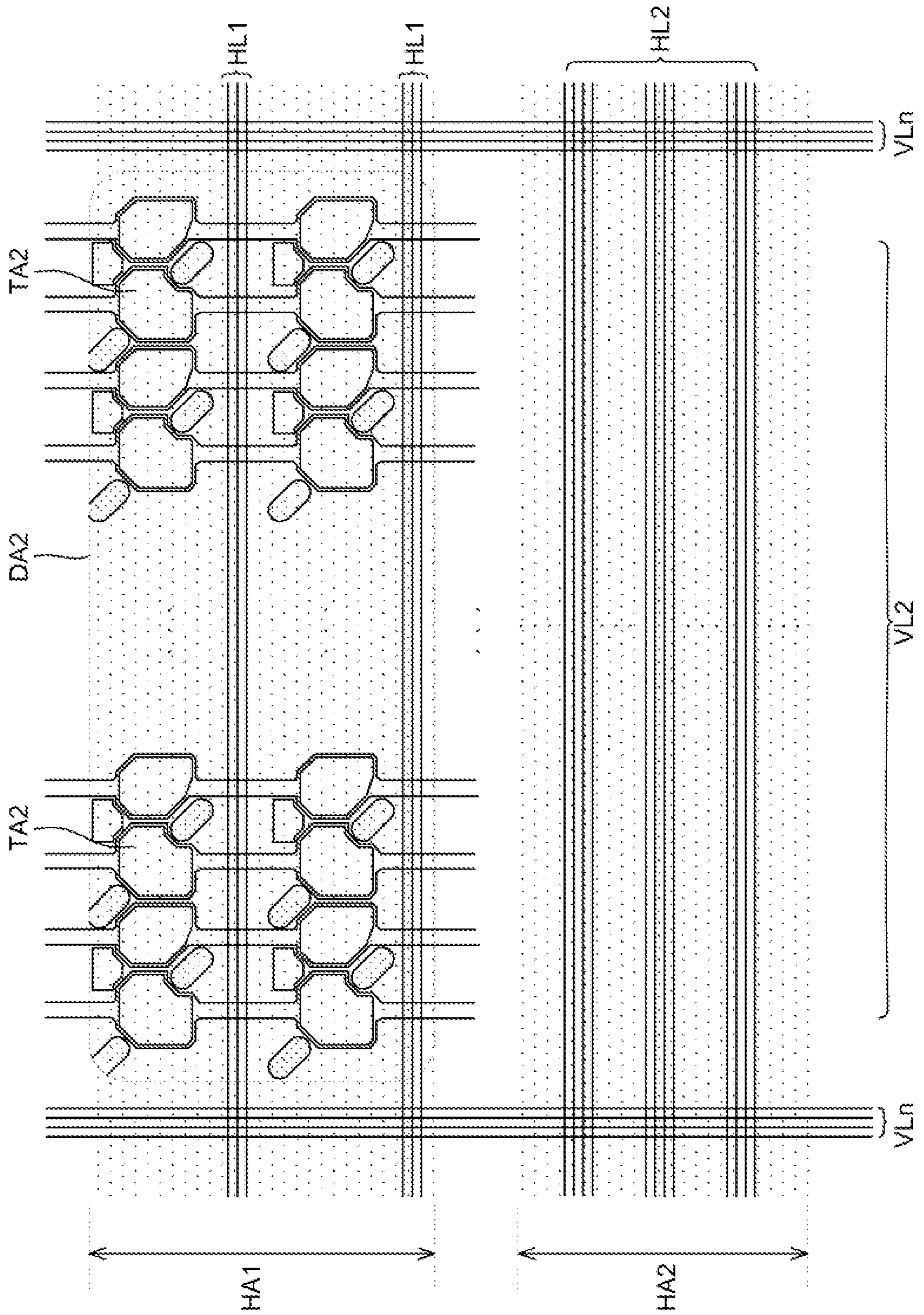
FIG. 5B is a view exemplarily illustrating a placement of a signal line in a second optical area and a normal area in a display panel according to an exemplary aspect of the present disclosure.

FIG. 5B is a view exemplarily illustrating a placement of a signal line in each of a second optical area and a normal area in a display panel according to an exemplary aspect of the present disclosure.

That is, FIG. 5A illustrates the placement of the signal line in each of the first optical area DA1 and the normal area in the display panel according to the exemplary aspect of the present disclosure. FIG. 5B illustrates the placement of the signal line in each of the second optical area DA2 and the normal area in the display panel according to the exemplary aspect of the present disclosure.

The first horizontal display area HA1 illustrated in FIGS. 5A and 5B is a part of the first horizontal display area HA1 in the display panel and the second horizontal display area HA2 is a part of the second horizontal display area HA2 in the display panel.

The first optical area DA1 illustrated in FIG. 5A is a part of the first optical area DA1 in the display panel and the second optical area DA2 illustrated in FIG. 5B is a part of the second optical area DA2 in the display panel.

Referring to FIGS. 5A and 5B, the first horizontal display area HA1 may include the normal area, the first optical area DA1, and the second optical area DA2. The second horizontal display area HA2 may include the normal area.

In the display panel, various types of horizontal lines HL1 and HL2 may be disposed and various types of vertical lines VLn, VL1, and VL2 may be disposed.

In the exemplary aspect of the present disclosure, the horizontal direction and the vertical direction refer to two intersecting directions and the horizontal direction and the vertical direction may vary according to a viewing direction. For example, in the exemplary aspect of the present disclosure, the horizontal direction refers to a direction in which one gate line extends and the vertical direction refers to a direction in which one data line extends. As described above, the horizontal direction and the vertical direction are exemplified.

Referring to FIGS. 5A and 5B, the horizontal line disposed in the display panel may include a first horizontal line HL1 disposed in the first horizontal display area HA1 and a second horizontal line HL2 disposed in the second horizontal display area HA2.

The horizontal line disposed in the display panel may be a gate line. That is, the first horizontal line HL1 and the second horizontal line HL2 may be gate lines. The gate line may include various types of gate lines depending on the structure of the sub pixel.

Referring to FIGS. 5A and 5B, the vertical line disposed in the display panel may include a normal vertical line VLn disposed only in the normal area, a first vertical line VL1 which passes through both the first optical area DA1 and the normal area and a second vertical line VL2 which passes through both the second optical area DA2 and the normal area.

The vertical line disposed in the display panel may include a data line and a driving voltage line and further include a reference voltage line and an initialization voltage line. That is, the normal vertical line VLn, the first vertical line VL1, and the second vertical line VL2 may include not only a data line and a driving voltage line but also a reference voltage line and an initialization voltage line.

In the exemplary aspect of the present disclosure, the term "horizontal" in the second horizontal line HL2 means that the signal is transmitted from a left side (or right side) to a right side (or left side), but may not mean that the second horizontal line HL2 straightly extends only in the exact horizontal direction. That is, in FIGS. 5A and 5B, the second horizontal line HL2 is illustrated as a straight line, but the second horizontal line HL2 may include a bent or curved portion. Similarly, the first horizontal line HL1 may also include a bent or curved portion.

In the exemplary aspect of the present disclosure, the term "vertical" in the normal vertical line VLn means that the signal is transmitted from an upper side (or lower side) to a lower side (or upper side), but may not mean that the normal vertical line VLn straightly extends only in the exact vertical direction. That is, in FIGS. 5A and 5B, the normal vertical line VLn is illustrated as a straight line, but the normal vertical line VLn may include a bent or curved portion. Similarly, the first vertical line VL1 and the second vertical line VL2 may include a bent or curved portion.

Referring to FIG. 5A, the first optical area DA1 included in the first horizontal display area HA1 may include an emission area and a first transmission area. In the first optical area DA1, an external area of the first transmission area may include the emission area.

Referring to FIG. 5A, to improve the transmittance of the first optical area DA1, the first horizontal line HL1 which passes through the first optical area DA1 may avoid the first transmission area in the first optical area DA1.

Accordingly, the first horizontal line HL1 which passes through the first optical area DA1 may include a curved section or a bending section which detours outside of an outer edge of the first transmission area.

Accordingly, the first horizontal line HL1 disposed in the first horizontal display area HA1 and the second horizontal line HL2 disposed in the second horizontal display area HA2 may have different shapes or lengths. That is, the first horizontal line HL1 which passes through the first optical area DA1 and the second horizontal line HL2 which does not pass through the first optical area DA1 may have different shapes or lengths.

Further, to improve the transmittance of the first optical area DA1, the first vertical line VL1 which passes through the first optical area DA1 may avoid the first transmission area in the first optical area DA1.

Accordingly, the first vertical line VL1 which passes through the first optical area DA1 may include a curved section or a bending section which detours outside of an outer edge of the first transmission area.

Accordingly, the first vertical line VL1 which passes through the first optical area DA1 and the normal vertical line VLn which does not pass through the first optical area DA1 and is disposed in the normal area may have different shapes or lengths.

Referring to FIG. 5A, the first transmission area included in the first optical area DA1 in the first horizontal display area HA1 may be diagonally disposed.

Referring to FIG. 5A, the emission area may be disposed between two first transmission areas which are adjacent to each other in the left and right in the first optical area DA1 in the first horizontal display area HA1. The emission area may be disposed between two first transmission areas which are adjacent to each other up and down in the first optical area DA1 in the first horizontal display area HA1.

Referring to FIG. 5A, the first horizontal line HL1 disposed in the first horizontal display area HA1, that is, the first horizontal line HL1 which passes through the first optical area DA1 may include at least one of curved section or a bending section which detours the outside of the outer edge of the first transmission area.

Referring to FIG. 5B, the second optical area DA2 included in the first horizontal display area HA1 may include an emission area and a second transmission area TA2. In the second optical area DA2, an outside area of the second transmission area TA2 may include the emission area.

The location and the placement state of the emission area and the second transmission area TA2 in the second optical area DA2 may be the same as the location and the placement state of the emission area and the first transmission area in the first optical area DA1 in FIG. 5A.

In contrast, as illustrated in FIG. 5B, the location and the placement state of the emission area and the second transmission area TA2 in the second optical area DA2 may be different from the location and the placement state of the emission area and the first transmission area in the first optical area DA1 in FIG. 5A.

For example, referring to FIG. 5B, in the second optical area DA2, the second transmission area TA2 may be disposed in the horizontal direction (left-right direction). The emission area may not be disposed between two second transmission areas TA2 adjacent in the horizontal direction (left-right direction). Further, the emission area in the second optical area DA2 may be disposed between the second transmission areas TA2 adjacent in the vertical direction (up and down direction). That is, the emission area may be disposed between two second transmission area TA2 rows.

When the first horizontal line HL1 passes through the second optical area DA2 in the first horizontal display area HA1 and the normal area therearound, the first horizontal line may pass through in the same manner as illustrated in FIG. 5A.

In contrast, as illustrated in FIG. 5B, when the first horizontal line HL1 passes through the second optical area DA2 in the first horizontal display area HA1 and the normal area therearound, the first horizontal line may pass through in the different manner from that illustrated in FIG. 5A.

That is, this is because the location and the placement state of the emission area and the second transmission area TA2 in the second optical area DA2 of FIG. 5B are different from the location and the placement state of the emission area and the second transmission area in the first optical area DA1 in FIG. 5A.

Referring to FIG. 5B, when the first horizontal line HL1 passes through the second optical area DA2 in the first horizontal display area HA1 and the normal area therearound, the first horizontal line HL1 may straightly pass between the second transmission areas TA2 adjacent in the vertical direction without a curved section or a bending section.

In other words, one first horizontal line HL1 has a curved section or a bending section in the first optical area DA1, but may not have a curved section or a bending section in the second optical area DA2.

To improve the transmittance of the second optical area DA2, the second vertical line VL2 which passes through the second optical area DA2 may avoid the second transmission area TA2 in the second optical area DA2.

Accordingly, the second vertical line VL2 which passes through the second optical area DA2 may include a curved section or a bending section which detours outside an outer edge of the second transmission area TA2.

Accordingly, the second vertical line VL2 which passes through the second optical area DA2 and the normal vertical line VLn which does not pass through the second optical area DA2 and is disposed in the normal area may have different shapes or lengths.

As illustrated in FIG. 5A, the first horizontal line HL1 which passes through the first optical area DA1 may have curved sections or bending sections which detour the outside of the outer edge of the first transmission area.

Accordingly, a length of the first horizontal line HL1 which passes through the first optical area DA1 and the second optical area DA2 may be slightly longer than a length of the second horizontal line HL2 which is disposed only in the normal area without passing through the first optical area DA1 and the second optical area DA2.

Accordingly, a resistance of the first horizontal line HL1 which passes through the first optical area DA1 and the second optical area DA2 may be slightly high than a resistance of the second horizontal line HL2 which is disposed only in the normal area without passing through the first optical area DA1 and the second optical area DA2. Hereinafter, the resistance of the first horizontal line HL1 is also referred to as a first resistance and the resistance of the second horizontal line HL2 is also referred to as a second resistance.

Referring to FIGS. 5A and 5B, according to the light transmission structure, the first optical area DA1 which at least partially overlaps with the first optical electronic device includes a plurality of first transmission areas TA1. The second optical area DA2 which at least partially overlaps with the second optical electronic device includes a plurality of second transmission areas TA2. Accordingly, the number of sub pixels for every unit area of the first optical area DA1 and the second optical area DA2 may be smaller than that of the normal area.

Accordingly, the number of sub pixels which are connected to the first horizontal line HL1 which passes through the first optical area DA1 and the second optical area DA2 may be different from the number of sub pixels which are connected to the second horizontal line HL2 which is disposed only in the normal area without passing through the first optical area DA1 and the second optical area DA2.

The number (first number) of sub pixels which are connected to the first horizontal line HL1 which passes through the first optical area DA1 and the second optical area DA2 may be smaller than the number (second number) of sub pixels which are connected to the second horizontal line HL2 which is disposed only in the normal area without passing through the first optical area DA1 and the second optical area DA2.

The difference between the first number and the second number may vary depending on the difference between a resolution of each of the first optical area DA1 and the second optical area DA2 and a resolution of the normal area. For example, the larger the difference between a resolution of each of the first optical area DA1 and the second optical area DA2 and a resolution of the normal area, the larger the difference between the first number and the second number.

As described above, the number (first number) of sub pixels which are connected to the first horizontal line HL1 which passes through the first optical area DA1 and the second optical area DA2 is smaller than the number (second number) of sub pixels which are connected to the second horizontal line HL2 which is disposed only in the normal area without passing through the first optical area DA1 and the second optical area DA2. Therefore, an area of the first horizontal line HL1 which overlaps with the other surrounding electrodes or lines may be smaller than an area of the second horizontal line HL2 which overlaps with the other surrounding electrodes or lines.

Accordingly, a parasitic capacitance (hereinafter, a first capacitance) formed by the first horizontal line HL1 and the other surrounding electrodes or lines may be much smaller than a parasitic capacitance (hereinafter, a second capacitance) formed by the second horizontal line HL2 and the other surrounding electrodes and lines.

In consideration of a magnitude relationship of the first resistance and the second resistance (first resistance second resistance) and a magnitude relationship of the first capacitance and the second capacitance (first capacitance«second capacitance), a resistance-capacitance (RC) value (hereinafter, first RC value) of the first horizontal line HL1 which passes through the first optical area DA1 and the second optical area DA2 may be much smaller than an RC value (hereinafter, second RC value) of the second horizontal line HL2 which is disposed only in the normal area without passing through the first optical area DA1 and the second optical area DA2 (first RC value«second RC value).

A signal transmission characteristic through the first horizontal line HL1 and a signal transmission characteristic through the second horizontal line HL2 may vary due to the difference (hereinafter, referred to as an RC load deviation) between the first RC value of the first horizontal line HL1 and the second RC value of the second horizontal line HL2.

Hereinafter, the normal area NA of the display device 100 will be described in more detail with reference to FIGS. 6 to 8 together.

Figure 6:
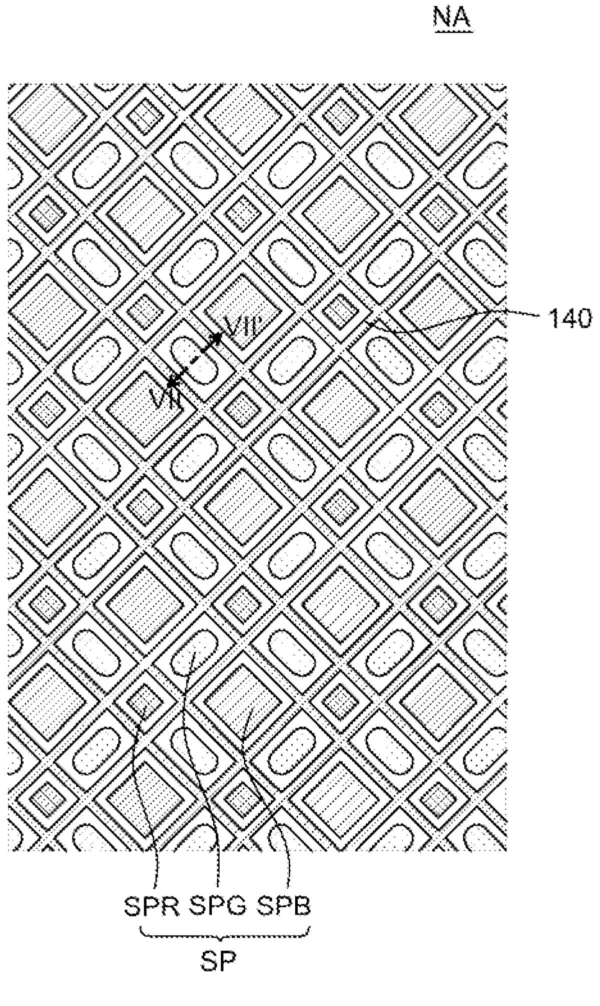
FIG. 6 is a schematic plan view enlarging a normal area of a display device of FIG. 1.
Figure 7:
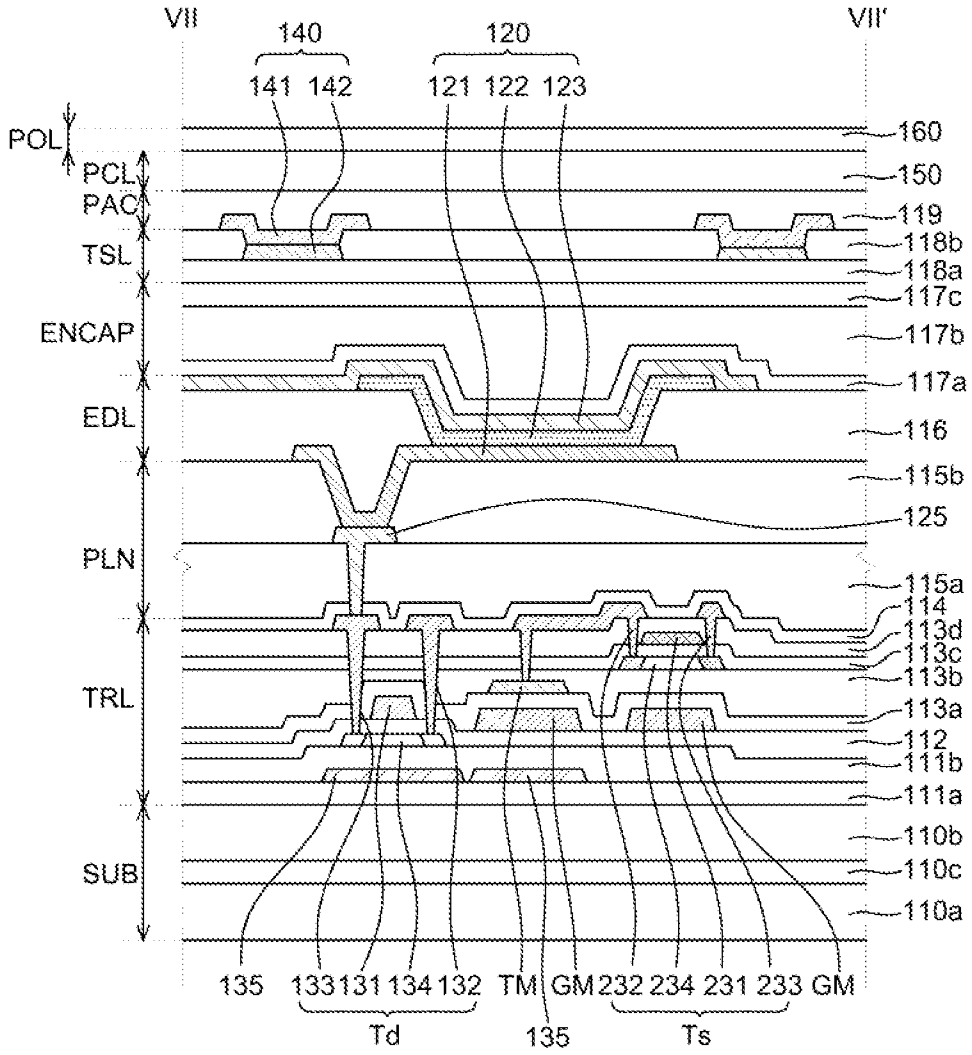
FIG. 7 is a cross-sectional view taken along line VII-VII' of FIG. 6.

FIG. 6 is a schematic plan view of enlarging a normal area NA of the display device of FIGS. 1A to 1D. FIG. 7 is a schematic cross-sectional view taken along line VII-VII' of FIG. 6. FIG. 8 is a schematic cross-sectional view taken along line VIII-VIII' of FIG. 1A.

In FIG. 6, for the convenience of description, only a plurality of sub pixels SP and a plurality of touch electrodes are illustrated.

A plurality of sub pixels SP may be included in the normal area NA. The plurality of sub pixels SP is a minimum unit which configures a screen and may include a plurality of light emitting diodes (ED) 120 to correspond to the plurality of sub pixels SP. That is, in the plurality of sub pixels SP, each of the light emitting diodes (ED) 120 may be disposed to correspond thereto so that the plurality of sub pixels SP may also be represented as a plurality of light emitting diodes (ED) 120. The plurality of sub pixels SP may emit light having different wavelengths. For example, the plurality of sub pixels SP may include a red sub pixel SPR, a green sub pixel SPG, and a blue sub pixel SPB. However, it is not limited thereto and the plurality of sub pixels SP may further include a white sub pixel.

In the normal area NA, a touch electrode 140 having mesh patterns which intersect each other may be disposed between the plurality of sub pixels SP. Accordingly, a user's touch input may be sensed on a top surface of the plurality of sub pixels SP disposed in the normal area.

Hereinafter, a cross-sectional structure of the normal area NA of the display device 100 will be described in more detail with reference to FIGS. 7 and 8 together.

In the normal area NA, a transistor layer TRL may be disposed above the substrate SUB and a planarization layer PLN may be disposed above the transistor layer TRL. Further, a light emitting diode layer EDL may be disposed above the planarization layer PLN, an encapsulation unit ENCAP may be disposed above the light emitting diode layer EDL, a touch sensing layer TSL may be disposed above the encapsulation unit ENCAP, and a passivation layer PAC may be disposed above the touch sensing layer TSL. Further, the organic layer PCL may be disposed above the passivation layer PAC and a polarization layer POL may be disposed above the organic layer PCL.

The substrate SUB is a component for supporting various components included in the display device 100 and may be formed of an insulating material. The substrate SUB may include a first substrate 110*a*, a second substrate 110*b*, and an interlayer insulating layer 110*c*. The interlayer insulating layer 110*c* may be disposed between the first substrate 110*a* and the second substrate 110*b*. As described above, the substrate SUB is configured by the first substrate 110*a*, the second substrate 110*b*, and the interlayer insulating layer 110*c* to suppress the moisture permeation. For example, the first substrate 110*a* and the second substrate 110*b* may be polyimide (PI) substrates.

In the normal area NA, on the transistor layer TRL, various patterns 131, 132, 133, 134, 231, 232, 233, and 234, various insulating layers 111*a*, 111*b*, 112, 113*a*, 113*b*, and 114, and various metal patterns TM, GM, and 135 for forming a transistor, such as a driving transistor Td and at least one switching transistor Ts and at least one capacitor, may be disposed.

Hereinafter, the lamination structure of the transistor layer TRL will be described in more detail.

A multi-buffer layer 111*a* may be disposed on a second substrate 110*b* and an active buffer layer 111*b* may be disposed on the multi-buffer layer 111*a*.

A metal layer 135 may be disposed on the multi-buffer layer 111*a*.

Here, the metal layer 135 may serve as a light shield and may also be referred to as a light shielding layer.

An active buffer layer 111*b* may be disposed on the metal layer 135.

A first active layer 134 of the driving transistor Td may be disposed on the active buffer layer 111*b*. For example, the first active layer 134 may be formed of polysilicon (p-Si), amorphous silicon (a-Si), or oxide semiconductor, but is not limited thereto. In the meantime, the driving transistor Td may include a first active layer 134, a first gate insulating layer 112, a first gate electrode 131, a first interlayer insulating layer 113*a*, a second interlayer insulating layer 113*b*, a second gate insulating layer 113*c*, and a first source electrode 132 and a first drain electrode 133. The first active layer 134 is formed on the active buffer layer 111*b*, the first gate insulating layer 112 covers the first active layer 134, the first gate electrode 131 is disposed on the first gate insulating layer 112, the first interlayer insulating layer 113*a* covers the first gate electrode 131. The second interlayer insulating layer 113*b* is disposed on the first interlayer insulating layer 113*a*, the second gate insulating layer 113*c* is disposed on the second interlayer insulating layer 113*b*, and the first source electrode 132 and the first drain electrode 133 are disposed on the second gate insulating layer 113*c*.

A first gate insulating layer 112 may be disposed on the first active layer 134. The first gate insulating layer 112 may be formed of silicon oxide SiOx, silicon nitride SiNx, or a double layer thereof.

Further, a first gate electrode 131 of the driving transistor Td may be disposed on the first gate insulating layer 112. The first gate electrode 131 is disposed on the first gate insulating layer 112 to overlap with the first active layer 134. The first gate electrode 131 may be formed of various conductive materials, for example, magnesium (Mg), aluminum (Al), nickel (Ni), chrome (Cr), molybdenum (Mo), tungsten (W), gold (Au), or an alloy thereof, but is not limited thereto.

A gate material layer GM may be disposed on the first gate insulating layer 112 in a position different from a forming position of the driving transistor Td.

The first interlayer insulating layer 113*a* may be disposed on the first gate electrode 131 and the gate material layer GM. A metal pattern TM may be disposed on the first interlayer insulating layer 113*a*. A second interlayer insulating layer 113*b* may be disposed while covering the metal pattern TM disposed on the first interlayer insulating layer 113*a*.

The second interlayer insulating layer 113*b* separates the second active layer 234 from the first active layer 134 and provides a base for forming the second active layer 234.

The second active layer 234 of the switching transistor Ts may be disposed on the second interlayer insulating layer 113*b*. For example, the second active layer 234 may be formed of polysilicon (p-Si), amorphous silicon (a-Si), or oxide semiconductor, but is not limited thereto.

A second gate insulating layer 113*c* may be disposed on the second active layer 234. Further, a second gate electrode 231 of the switching transistor Ts may be disposed on the second gate insulating layer 113*c*. The second gate electrode 231 is disposed on the second gate insulating layer 113*c* to overlap with the second active layer 234.

The second gate insulating layer 113*c* covers the second active layer 234 of the switching transistor Ts. The second gate insulating layer 113*c* is formed on the second active layer 234 so that the second gate insulating layer is implemented by an inorganic film. For example, the second gate insulating layer 113*c* may be silicon oxide ($SiO_2$), silicon nitride (SiNx), or a double layer thereof.

The second gate electrode 231 is configured by a metal material. For example, the second gate electrode 231 may be formed of a single layer or multiple layers formed of any one of molybdenum (Mo), aluminum (Al), chrome (Cr), gold (Au), titanium (Ti), nickel (Ni), neodymium (Nd), and copper (Cu) or an alloy thereof, but is not limited thereto.

In the meantime, the switching transistor Ts is formed on the second interlayer insulating layer 113*b* and includes a second active layer 234, a second gate insulating layer 113*c* which covers the second active layer 234, a second gate electrode 231 disposed on the second gate insulating layer 113*c*, a third interlayer insulating layer 113*d* which covers the second gate electrode 231, and a second source electrode 232 and a second drain electrode 233 disposed on the third interlayer insulating layer 113*d*.

The switching transistor Ts further includes a gate material layer GM which is located below the first interlayer insulating layer 113*a* and overlaps with the second active layer 234. The gate material layer GM blocks light which is incident onto the second active layer 234 to ensure the reliability of the switching transistor Ts. The gate material layer GM may be formed by the same material as the first gate electrode 131 and may be formed on an upper surface of the first gate insulating layer 112. The gate material layer GM is electrically connected to the second gate electrode 231 to configure a dual gate. The first source electrode 132 and the first drain electrode 133 of the driving transistor Td and the second source electrode 232 and the second drain electrode 233 of the switching transistor Ts may be disposed on the third interlayer insulating layer 113*d*.

The second source electrode 232 and the second drain electrode 233 are simultaneously formed of the same material as the first source electrode 132 and the first drain electrode 133 on the third interlayer insulating layer 113*d* to reduce the number of mask processes.

The first source electrode 132 and the first drain electrode 133 may be connected to one side and the other side of the first active layer 134, respectively, through contact holes formed in the third interlayer insulating layer 113*d*, the second gate insulating layer 113*c*, the second interlayer insulating layer 113*b*, the first interlayer insulating layer 113*a*, and the first gate insulating layer 112.

The second source electrode 232 and the second drain electrode 233 may be connected to one side and the other side of the second active layer 234, respectively, through contact holes formed in the third interlayer insulating layer 113*d* and the second gate insulating layer 113*c*.

The first source electrode 132 and the first drain electrode 133 and the second source electrode 232 and the second drain electrode 233 may be a single layer or multiple layers formed of various conductive materials, for example, magnesium (Mg), aluminum (Al), nickel (Ni), chrome (Cr), molybdenum (Mo), tungsten (W), gold (Au), or an alloy thereof, but is not limited thereto.

A part of the first active layer 134 which overlaps with the first gate electrode 131 is a channel region. One of the first source electrode 132 and the first drain electrode 133 is connected to one side of the channel region in the first active layer 134 and the other one is connected to the other side of the channel region in the first active layer 134.

The second active layer 234 may be configured with the same shape as the first active layer 134. When the second active layer 234 is implemented by an oxide semiconductor material, the second active layer 234 may include an intrinsic second channel region not doped with impurities, and a second source region and a second drain region doped with impurities to be conductive.

A passivation layer 114 may be disposed on the first source electrode 132, the first drain electrode 133, the second source electrode 232 and the second drain electrode 233. The passivation layer 114 is provided to protect the driving transistor Td and may be formed of an inorganic film, for example, silicon oxide SiOx, silicon nitride SiNx, or a double layer thereof.

In the meantime, the gate material layer GM and the metal pattern TM are disposed on the first gate insulating layer 112 to overlap with to implement a capacitor Cst. For example, the metal pattern TM may be a single layer or multiple layers formed of any one of molybdenum (Mo), aluminum (Al), chrome (Cr), gold (Au), titanium (Ti), nickel (Ni), neodymium (Nd), and copper (Cu), or an alloy thereof.

The capacitor Cst stores a data voltage which is applied through the data line DL for a predetermined period and then supplies the data voltage to the light emitting diode (ED) 120. The capacitor Cst includes two corresponding electrodes and a dielectric material disposed therebetween. The first interlayer insulating layer 113*a* is located between the gate material layer GM and the metal pattern TM.

The gate material layer GM or the metal pattern TM of the capacitor Cst may be electrically connected to the second source electrode 232 or the second drain electrode 233 of the switching transistor Ts. However, it is not limited thereto and a connection relationship of the capacitor Cst may vary according to the pixel driving circuit.

Further, the metal layer 135 is disposed on the multi-buffer layer 111*a* to further overlap with the gate material layer GM and the metal pattern TM to configure a double capacitor Cst.

In the exemplary aspect of the present specification, at least one switching transistor Ts uses the oxide semiconductor as an active layer. The transistor which uses the oxide semiconductor as an active layer has an excellent leakage current blocking effect and has a manufacturing cost which is cheaper than the transistor which uses the polycrystalline silicon as an active layer. Accordingly, to reduce the power consumption and lower the manufacturing cost, the pixel circuit according to the exemplary aspect of the present specification includes a driving transistor or at least one switching transistor which uses the oxide semiconductor material.

All the transistors which configure the pixel circuit including the driving transistor may implement the active layer using the oxide semiconductor or only some of the transistors may implement the active layer using the oxide semiconductor.

However, it is difficult for the transistor using the oxide semiconductor to ensure the reliability and the transistor using the polycrystalline silicon has a faster operation speed and excellent reliability. Accordingly, the exemplary aspect of the present specification includes the transistor using the oxide semiconductor and the transistor using the polycrystalline silicon. However, it is not limited thereto and in accordance with the design, only a transistor using the oxide semiconductor is applied or only a transistor using the polycrystalline silicon is applied to configure the pixel circuit.

The planarization layer PLN may be located above the transistor layer TRL.

The planarization layer PLN may include a first planarization layer 115*a* and a second planarization layer 115*b*. The planarization layer PLN protects the driving transistor Td and planarizes an upper portion of the driving transistor.

The first planarization layer 115*a* may be disposed on the passivation layer 114.

The connection electrode 125 may be disposed on the first planarization layer 115*a*.

The connection electrode 125 may be connected to one of the first source electrode 132 and the first drain electrode 133 through a contact hole provided in the first planarization layer 115*a*.

The second planarization layer 115*b* may be disposed on the connection electrode 125.

The light emitting diode layer EDL may be located above the second planarization layer 115*b*.

Hereinafter, a lamination structure of the light emitting diode layer EDL will be described in detail.

The anode 121 may be disposed on the second planarization layer 115*b*. At this time, the anode 121 may be electrically connected to the connection electrode 125 through the contact hole provided in the second planarization layer 115*b*. The anode 121 may be formed of a metal material.

When the display device 100 is a top emission type in which light emitted from the light emitting diode (ED) 120 is emitted above the substrate SUB in which the light emitting diode (ED) 120 is disposed, the anode 121 may further include a transparent conductive layer and a reflective layer on the transparent conductive layer. The transparent conductive layer may be formed of transparent conductive oxide such as ITO and IZO and the reflective layer may be formed of, for example, silver (Ag), aluminum (Al), gold (Au), molybdenum (Mo), tungsten (W), chrome (Cr), or an alloy thereof.

The bank 116 may be disposed while covering the anode 121. A part of the bank 116 corresponding to an emission area of the sub pixel may be open. A part of the anode 121 may be exposed through the open part of the bank 116 (hereinafter, referred to as an open area). At this time, the bank 116 may be formed of an inorganic insulating material, such as silicon nitride (SiNx) or silicon oxide (SiOx), or an organic insulating material, such as benzocyclobutene resin, acrylic resin or imide resin, but is not limited thereto.

Even though it is not illustrated, a spacer may be further formed on the bank 116. The spacer may be configured with the same material as the bank 116.

The emission layer 122 may be disposed in the open area of the bank 116 and in the vicinity of the open area of the bank. Therefore, the emission layer 122 may be disposed on the anode 121 exposed through the open area of the bank 116.

The cathode 123 may be disposed on the emission layer 122.

The light emitting diode (ED) 120 may be formed by the anode 121, the emission layer 122, and the cathode 123. The emission layer 122 may include a plurality of organic films.

The encapsulation unit ENCAP may be located above the above-described light emitting diode layer EDL.

The encapsulation unit ENCAP may have a single-layered structure or a multi-layered structure. For example, the encapsulation unit ENCAP may include a first encapsulation layer 117*a*, a second encapsulation layer 117*b*, and a third encapsulation layer 117*c*.

At this time, the first encapsulation layer 117*a* and the third encapsulation layer 117*c* may be configured by inorganic films and the second encapsulation layer 117*b* may be configured by an organic film. Among the first encapsulation layer 117*a*, the second encapsulation layer 117*b*, and the third encapsulation layer 117*c*, the second encapsulation layer 117*b* is thickest and may serve as a planarization layer.

The first encapsulation layer 117*a* may be disposed on the cathode 123 and may be disposed to be most adjacent to the light emitting diode (ED) 120. The first encapsulation layer 117*a* may be formed of an inorganic insulating material on which low-temperature deposition may be performed. For example, the first encapsulation layer 117*a* may be configured by silicon nitride (SiNx), silicon oxide (SiOx), silicon oxynitride (SiON), or aluminum oxide ($Al_2O_3$). The first encapsulation layer 117*a* is deposited under a low temperature atmosphere so that during the deposition process, the damage of the emission layer 122 including an organic material which is vulnerable to the high temperature atmosphere may be suppressed.

The second encapsulation layer 117*b* may be formed to have a smaller area than that of the first encapsulation layer 117*a*. In this case, the second encapsulation layer 117*b* may be formed to expose both ends of the first encapsulation layer 117*a*. The second encapsulation layer 117*b* may serve as a buffer to alleviate stress between the layers due to bending of the flexible display device and to enhance planarization performance.

For example, the second encapsulation layer 117*b* may be formed of an organic insulating material, such as acrylic resin, epoxy resin, polyimide, polyethylene, or silicon oxy carbon (SiOC). For example, the second encapsulation layer 117*b* may be formed by an inkjet method, but is not limited thereto.

Even though it is not illustrated, a color filter may be disposed on the encapsulation unit ENCAP.

Figure 8:
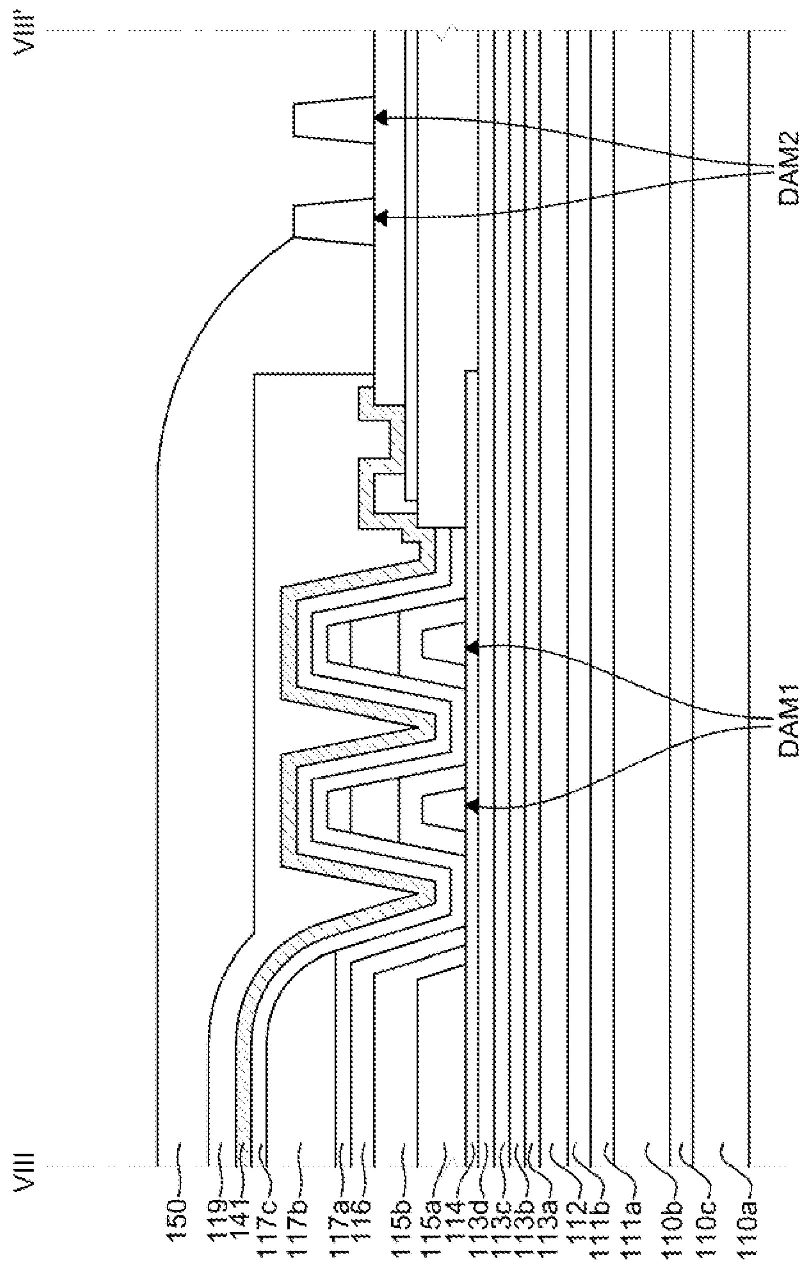
FIG. 8 is a cross-sectional view taken along line VIII-VIII' of FIG. 1A.

Referring to FIG. 8 together, a first dam DAM1 which blocks the flow of the second encapsulation layer 117*b* which configures the encapsulation unit ENCAP may be disposed in the non-display area NDA. To suppress the collapse of the encapsulation unit ENCAP, one or more first dams DAM1 may be disposed at an end portion of the inclined surface of the encapsulation unit ENCAP or in the vicinity thereof. One or more first dams DAM1 may be disposed in a boundary of the display area DA and the non-display area NDA or in the vicinity of the boundary. The first dam DAM1 may be formed of at least one or more layers formed of an organic material. For example, the first dam DAM1 may include a lower layer formed on the same layer with the same material as the second planarization layer 115*b* and an upper layer formed on the same layer with the same material as the bank 116, but is not limited thereto. Further, a height of the first dam DAM1 may be further controlled by adding a layer formed of the same material as the spacer on the upper layer of the first dam DAM1, but is not limited thereto.

The second encapsulation layer 117*b* including an organic material may be located only on an inner side surface of an innermost dam of the first dam DAM1. That is, the second encapsulation layer 117*b* may not be disposed on an upper portion of all the dams. In contrast, the second encapsulation layer 117*b* including an organic material may be located above at least an innermost dam of the first dam DAM1. That is, the second encapsulation layer 117*b* may be located to extend to an upper portion of the innermost dam of the first dam DAM1. Alternatively, the second encapsulation layer 117*b* may be located to extend to an upper portion of a dam located at the outside of the first dam DAM1 by passing an upper portion of at least the innermost dam of the first dam DAM1.

The third encapsulation layer 117*c* may be formed above the substrate SUB on which the second encapsulation layer 117*b* is formed to cover upper surfaces and side surfaces of the second encapsulation layer 117*b* and the first encapsulation layer 117*a*, respectively. At this time, the third encapsulation layer 117*c* may minimize or block the permeation of external moisture or oxygen into the second encapsulation layer 117*b* and the first encapsulation layer 117*a*. For example, the third encapsulation layer 117*c* may be configured by an inorganic insulating material, such as silicon nitride (SiNx), silicon oxide (SiOx), silicon oxynitride (SiON), and aluminum oxide ($Al_2O_3$).

The touch sensing layer TSL may be disposed above the above-described encapsulation unit ENCAP.

A touch buffer layer 118*a* may be disposed above the encapsulation unit ENCAP and a touch electrode 140 may be disposed on the touch buffer layer 118*a*.

The touch electrode 140 may include a touch sensor electrode 141 and a bridge electrode 142 located on different layers. A touch interlayer insulating layer 118*b* may be disposed between the touch sensor electrode 141 and the bridge electrode 142.

For example, the touch sensor electrode 141 may include a first touch sensor electrode, a second touch sensor electrode, and a third touch sensor electrode which are disposed to be adjacent to each other. For example, the first touch sensor electrode and the second touch sensor electrode are disposed in the first direction and the third touch sensor electrode may be disposed in a second direction intersecting the first touch sensor electrode and the second touch sensor electrode. The first touch sensor electrode and the second touch sensor electrode are electrically connected. However, when there is the third touch sensor electrode disposed in the second direction intersecting the first direction between the first touch sensor electrode and the second touch sensor electrode disposed in the first direction, the first touch sensor electrode and the second touch sensor electrode may be electrically connected through the bridge electrode 142 on the different layer. The bridge electrode 142 may be insulated from the third touch sensor electrode by a touch interlayer insulating layer 118*b*.

In other words, to suppress the disconnection of the plurality of touch electrodes disposed in the first direction and the second direction, in the intersecting area, the plurality of touch electrodes extending in the first direction may be electrically connected through the bridge electrode 142.

When the touch sensing layer TSL is formed, chemical solution (for example, developer or etchant) used for the process or moisture from the outside may be generated. The touch buffer layer 118*a* is disposed and the touch sensing layer TSL is disposed thereon to suppress the permeation of chemical solution or moisture during the manufacturing of the touch sensing layer TSL into the emission layer 122 including an organic material. By doing this, the touch buffer layer 118*a* may suppress the damage of the emission layer 122 which is vulnerable to the chemical solution or the moisture.

The touch buffer layer 118*a* may be formed of an organic insulating material which is capable of being formed at a low temperature of a predetermined temperature (for example, 100° C.) or lower to suppress the damage of the emission layer 122 including an organic material which is vulnerable to a high temperature. The organic insulating material has a low permittivity of 1 to 3. For example, the touch buffer layer 118*a* may be formed of acrylic, epoxy, or siloxane-based material. As the flexible display device is bent, the encapsulation unit ENCAP may be damaged and the touch sensor electrode 141 disposed above the touch buffer layer 118*a* may be broken. Even though the flexible display device is bent, the touch buffer layer 118*a* which is configured of an organic insulating material to have a planarization performance may suppress the damage of the encapsulation unit ENCAP and the breakage of the touch sensor electrode 141 and the bridge electrode 142 which configure the plurality of touch electrodes 140.

The passivation layer (PAC) 119 may be disposed to cover the plurality of touch electrodes 140. The passivation layer 119 may be configured by an organic insulating layer.

The organic layer (PCL) 150 is disposed to cover the passivation layer 119.

When only the passivation layer 119 formed of the organic insulating film is disposed on the uppermost layer of the display device 100, a step caused by the touch sensing layer TSL disposed below the passivation layer 119 is not completely supplemented only with the passivation layer 119. Therefore, there may be a problem in that a stain caused by the plurality of touch electrodes 140 is visible to the user.

The organic layer 150 formed of an organic insulating film is added above the passivation layer 119 to suppress the step on the uppermost layer of the display device 100, thereby improving the visibility of the display device 100.

The organic layer 150 may be formed of the same material as the second encapsulation layer 117*b* of the encapsulation unit ENCAP and for example, may be formed of an organic insulating material, such as acrylic resin, epoxy resin, polyimide, polyethylene, or silicon oxy carbon (SiOC). The organic layer 150 may be formed by the inkjet method, but is not limited thereto.

Referring to FIG. 8 together, a second dam DAM2 may be further provided at the outer periphery of the first dam DAM1 disposed in the non-display area NDA. For example, the second dam DAM2 may be formed on the same layer with the same material as the passivation layer 119. A height of the second dam DAM2 may be higher than the height of the first dam DAM1 and block the organic layer 150 from flowing to the pad disposed in the non-display area NDA.

The polarization layer (POL) 160 is disposed on the organic layer 150.

The polarization layer 160 suppress reflection of external light on the display area DA of the substrate SUB. When the display device 100 is used at the outside, external natural light enters to be reflected by a reflective layer included in the anode 121 of the light emitting diode or reflected by an electrode which is formed of a metal and disposed below the light emitting diode (ED) 120. Therefore, the image of the display device 100 may not be visibly recognized due to the light reflected as described above. The polarization layer 160 polarizes the light entering from the outside to a specific direction and suppresses the reflected light from being emitted to the outside of the display device 100.

Even though it is not illustrated, a cover glass may be bonded onto the polarization layer 160 through an adhesive layer. The adhesive layer may serve to adhere the respective components of the display device 100 to each other, and for example, may be formed using an optically clear display adhesive, such as a pressure sensitive adhesive, an optical clear adhesive or an optical clear resin (OCR), but is not limited thereto.

The cover glass may protect the component of the display device 100 from the external impact and suppress damages such as a scratch.

Hereinafter, a first optical area DA1 of the display device 100 will be described in more detail with reference to FIGS. 9 and 10 together.

Figure 9:
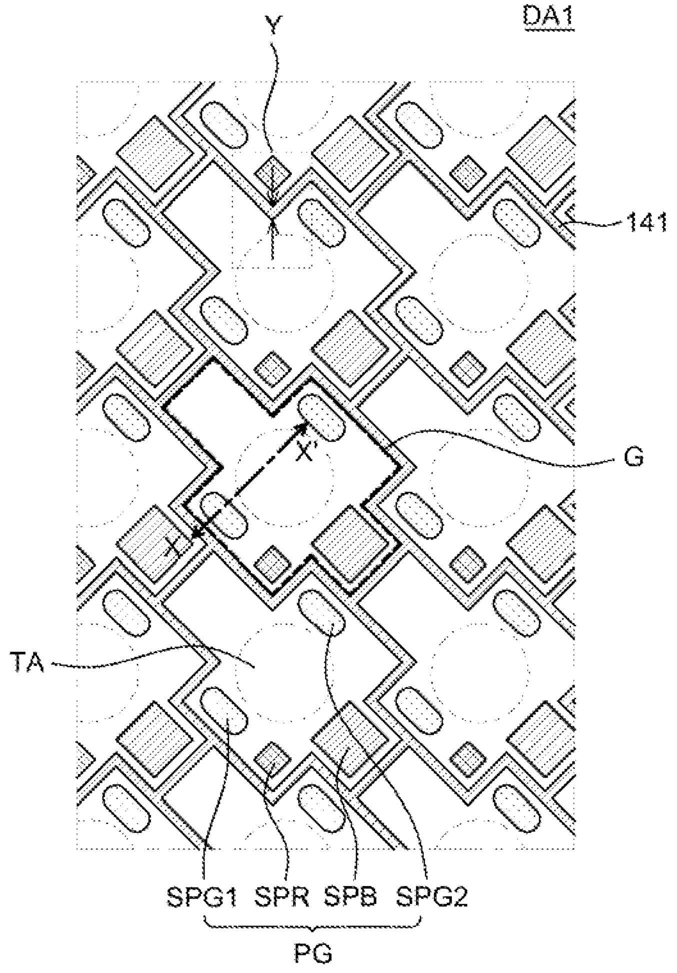
FIG. 9 is a schematic plan view enlarging a first optical area of a display device of FIG. 1.

FIG. 9 is a schematic plan view enlarging a first optical area DA1 of a display device of FIG. 1A. FIG. 10 is a schematic cross-sectional view taken along line X-X' of FIG. 9.

In FIG. 9, for the convenience of description, only a plurality of transmission areas, a plurality of sub pixels and a plurality of touch electrodes are illustrated.

Figure 10:
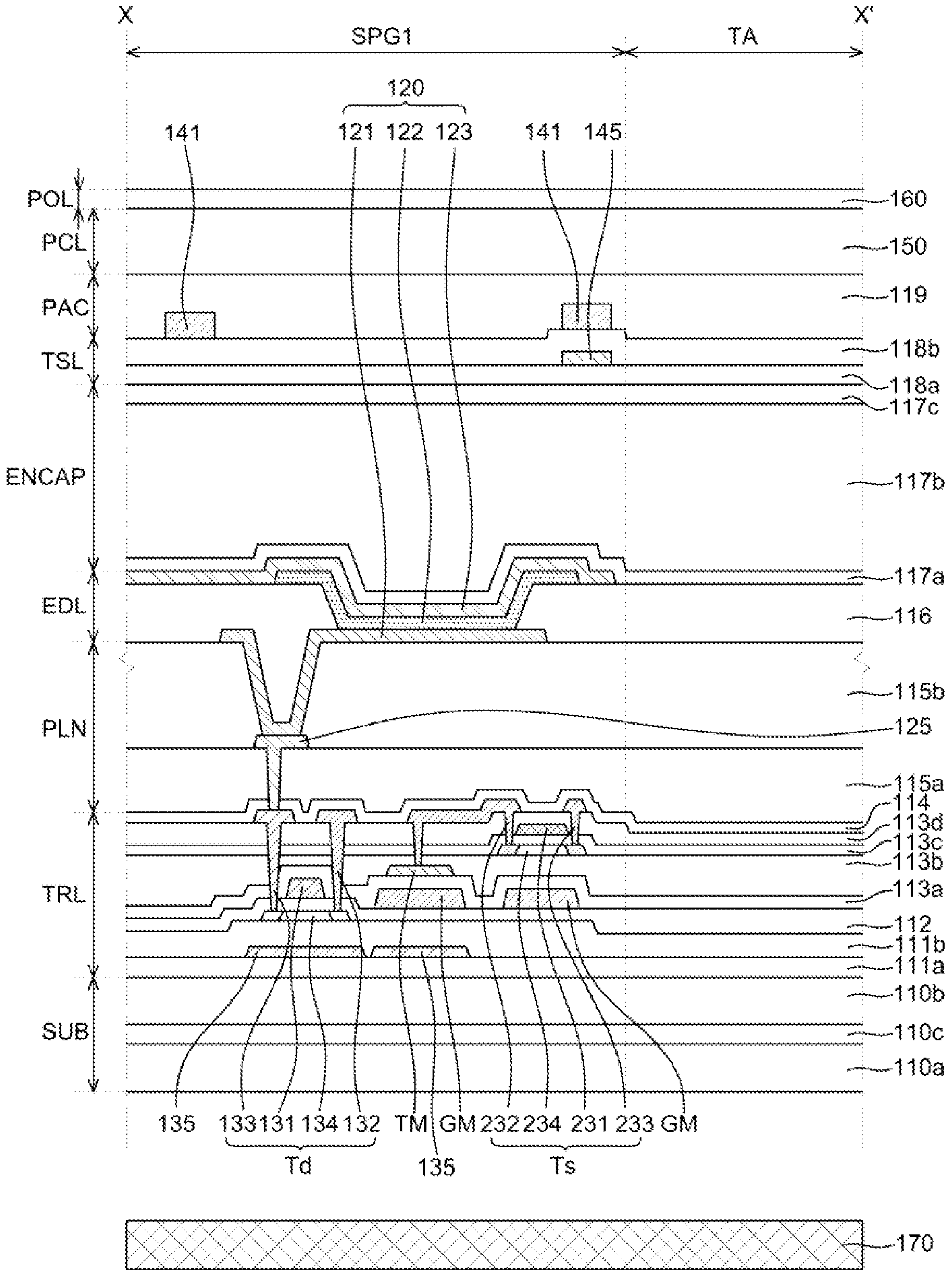
FIG. 10 is a cross-sectional view taken along line X-X' of FIG. 9.

Referring to FIGS. 9 and 10 together, the first optical area DA1 may include a plurality of transmission areas TA and a plurality of sub pixels SP which encloses the plurality of transmission areas.

All the transmission area TA of the first optical area DA1 and the plurality of sub pixels SP which encloses the transmission area TA may basically include a substrate SUB, a transistor layer TRL, a planarization layer PLN, a light emitting diode layer EDL, an encapsulation unit ENCAP, a touch sensing layer TSL, a passivation layer PAC, an organic layer PCL, and a polarization layer POL.

A substrate SUB, a transistor layer TRL, a planarization layer PLN, a light emitting diode layer EDL, an encapsulation unit ENCAP, a touch sensing layer TSL, a passivation layer PAC, an organic layer PCL, and a polarization layer POL which are included in the first optical area DA1 are substantially the same as the components having the same reference numerals disposed in the normal area NA of the display panel DP. Therefore, a redundant description will be omitted.

First, the transmission area TA disposed in the first optical area DA1 will be described.

The transmission area TA of the first optical area DA1 refers to a region in which the cathode 123 exposes the bank 116. For example, the plurality of transmission areas TA is areas from which an opaque configuration such as the cathode 123 is removed to allow external light to pass through the optical electronic device 170.

Specifically, the substrate SUB and various insulating layers 111*a*, 111*b*, 112, 113*a*, 113*b*, 114, 115*a*, 115*b*, 117*a*, 117*b*, 117*c*, and PAC disposed in the one sub pixel SPG1 of the first optical area DA1 may also be disposed in the transmission area TA of the first optical area DA1 in the same way.

However, in the one sub pixel SPG1 area of the first optical area DA1, a material layer (for example, a metal material layer or a semiconductor layer) having an electric characteristic or an opaque characteristic may not be disposed in the transmission area TA of the first optical area DA1, other than the insulating material.

For example, the cathode 123 included in the light emitting diode (ED) 120 and the metal material layers 135, 131, GM, TM, 132, 133, and 125 related to the transistor and the semiconductor layer 134 are not disposed in the transmission area TA. Further, the anode 121 included in the light emitting diode (ED) 120 may not be disposed in the transmission area TA. The emission layer 122 may be disposed in the transmission area TA, or may not be disposed in the transmission area. Further, the plurality of touch electrodes is not disposed in the transmission area TA, but the present disclosure is not limited thereto.

That is, the transmission area TA of the first optical area overlaps with the optical electronic device 170 so that for the purpose of the normal operation of the optical electronic device 170, an opaque component, such as a metal electrode, is not disposed in the transmission area TA to increase the transmittance of the transmission area TA.

Next, an area in which one sub pixel SPG1 which is disposed in the first optical area DA1 and is adjacent to one transmission area TA, among the plurality of sub pixels SP enclosing the plurality of transmission areas TA, is disposed will be described.

The area in which one sub pixel SPG1 adjacent to one transmission area TA in the first optical area DA1 has the substantially same structure as the structure of the normal area NA of the display panel DP excluding the touch sensing layer TSL including the plurality of touch electrodes so that a redundant description will be omitted.

Each of the plurality of sub pixels SP which encloses the plurality of transmission areas TA may include a light emitting diode (ED) 120 and a driving circuit. That is, in the plurality of sub pixels SP, each of the light emitting diodes (ED) 120 may be disposed to correspond thereto so that the plurality of sub pixels SP may also be represented as a plurality of light emitting diodes (ED) 120.

In the related art, when a plurality of transmission areas and a plurality of sub pixels are disposed in the first optical area, a plurality of touch electrodes is disposed to intersect between the plurality of sub pixels. The plurality of intersecting touch electrodes disposed between the plurality of sub pixels avoids only the plurality of transmission areas. That is, in the related art, the plurality of touch electrodes which intersects the plurality of transmission areas is very adjacent to each other. However, in this case, the plurality of touch electrodes is disposed between the plurality of sub pixels of the first optical area so that the touch line blocks the plurality of sub pixels to degrade the luminous characteristic. Further, the interval between the plurality of transmission areas and the plurality of touch electrodes is small so that it is vulnerable to the touch noise in the plurality of transmission areas.

Accordingly, in the display device 100 according to the exemplary aspect of the present disclosure, the plurality of sub pixels SP disposed in the first optical areas DA1 is grouped to a plurality of sub pixel groups PG which encloses the plurality of transmission areas TA. In the first optical area DA1, the plurality of touch electrodes 140 is disposed to have a closed curve shape which encloses one transmission area TA among the plurality of transmission areas TA and one sub pixel group PG among the plurality of sub pixel groups PG. In other words, one transmission area TA and one sub pixel group PG may be configured as one group G.

For example, the plurality of sub pixel groups PG which encloses the plurality of transmission areas TA may include a red sub pixel SPR, a first green sub pixel SPG1, a blue sub pixel SPB, and a second green sub pixel SPG2.

The plurality of touch electrodes 140 disposed in the first optical area DA1 may have a closed curve shape having a "x" shape or "+" shape mesh pattern to enclose one transmission area TA among the plurality of transmission areas and one sub pixel group PG among the plurality of sub pixel groups, that is, one group G.

In the first optical area DA1, between one transmission area TA among the plurality of transmission areas TA and one sub pixel group PG among the plurality of sub pixel groups PG, that is, in one group G, the touch electrode 140 is not disposed between the transmission area TA and the plurality of sub pixels SP. Therefore, the sub pixel SP blocking phenomenon in the transmission area TA may be improved and thus the luminosity factor of the display device 100 may be improved.

Even though in FIG. 9, it is illustrated that the transmission area TA has a circular shape, the shape of the transmission area TA is not limited as long as the contact with the plurality of touch electrodes 140 is minimized. For example, the shape of the transmission area may be various shapes, such as a circle, a triangle, an oval, a rectangle, or a polygon.

Further, as the touch electrode 140 is disposed to enclose one group G, the touch electrode is spaced apart from the plurality of transmission areas TA with a predetermined interval or more. Therefore, a touch noise problem which may be caused when the plurality of transmission areas TA and the plurality of touch electrodes 140 are adjacent may be reduced.

However, referring to FIG. 9, even though the touch electrode 140 is disposed to enclose one group G, there may be an area Y in which the plurality of transmission areas TA and the plurality of touch electrodes 140 are adjacent in the first optical area DA1.

In the area Y in which the plurality of transmission areas TA and the plurality of touch electrodes 140 of the first optical area DA1 are adjacent, a touch noise may be generated. To solve the problem, when the plurality of transmission areas TA is reduced, the transmittance in the first optical area DA1 is lowered so that an operation of the optical electronic device 170, such as a camera or a sensor, may be restricted.

Therefore, in the display device 100 according to the exemplary aspect of the present disclosure, the plurality of transmission areas TA ensures a transmittance to allow the optical electronic device 170 to normally operate and a plurality of shielding patterns 145 is disposed between the encapsulation unit ENCAP and the plurality of touch electrodes 140, so as to shield the touch noise generated when the plurality of transmission areas TA and the plurality of touch electrodes 140 are adjacent.

The plurality of shielding patterns 145 is grounded to effectively shield the touch noise generated when the plurality of transmission areas TA and the plurality of touch electrodes 140 are adjacent. Specifically, the plurality of shielding patterns 145 is connected to a ground line GND to which a ground voltage is applied to be applied with the ground voltage. Therefore, the plurality of shielding patterns 145 may serve as a ground which blocks the touch noise during the touch driving, which will be described in detail with reference to FIGS. 11A to 11D.

The plurality of shielding patterns 145 may be disposed to overlap with the plurality of touch electrodes 140 in a boundary area of the transmission area TA and one sub pixel SP adjacent to the transmission area TA.

Therefore, a touch noise signal which may be generated when the transmission area TA and the plurality of touch electrodes 140 are adjacent is shielded by the plurality of shielding patterns 145 to suppress the touch noise of the display device 100.

The plurality of shielding patterns 145 may be disposed on the same layer with the same material as the bridge electrode 142 disposed in the normal area NA.

Therefore, when the plurality of shielding patterns 145 is formed, the plurality of shielding patterns 145 may be formed using the same mask as the bridge electrode 142 without applying an additional mask so that the process steps may be reduced and the cost may be saved.

A width of the plurality of shielding patterns 145 may be equal to or larger than a width of the plurality of touch electrodes 140. When the width of the plurality of shielding patterns 145 is larger than the width of the plurality of touch electrodes 140, a touch noise shielding effect by the plurality of shielding patterns 145 may be further improved. For example, the width of each shielding pattern 145 of the plurality of shielding patterns 145 may be larger than the width of a touch electrode 140 overlapping with the shielding pattern 145 of the plurality of touch electrodes 140.

Hereinafter, the grounding of the plurality of shielding patterns 145 will be described in more detail with reference to FIGS. 11A to 11D together.

Figure 11A:
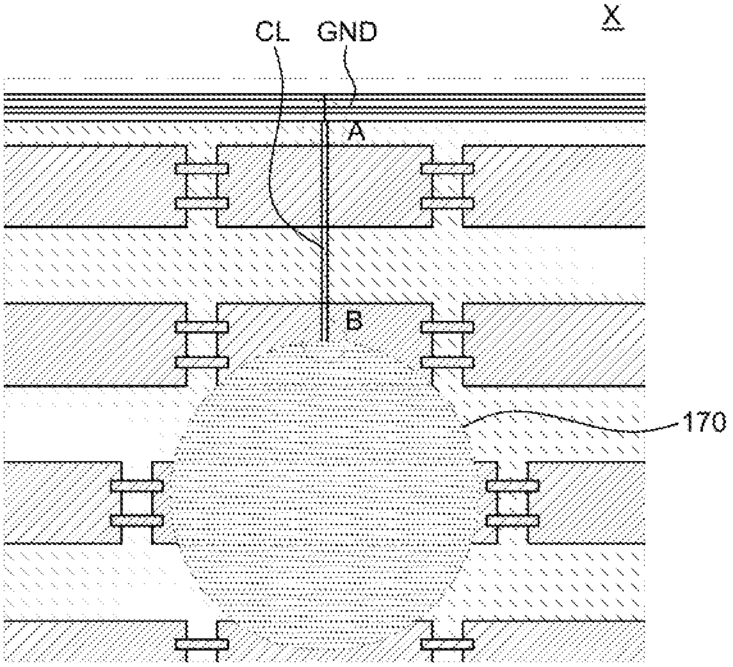
FIG. 11A is a schematic plan view illustrating area X of FIG. 1.
Figure 11B:
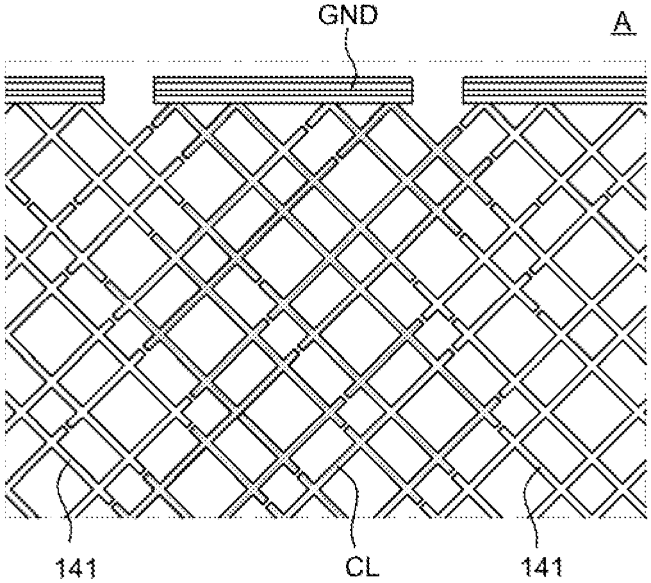
FIG. 11B is a schematic plan view illustrating area A of FIG. 11A.
Figure 11C:
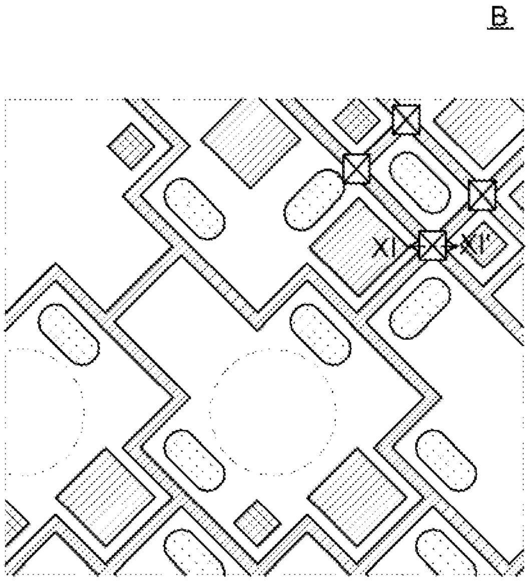
FIG. 11C is a schematic plan view illustrating area B of FIG. 11A.
Figure 11D:
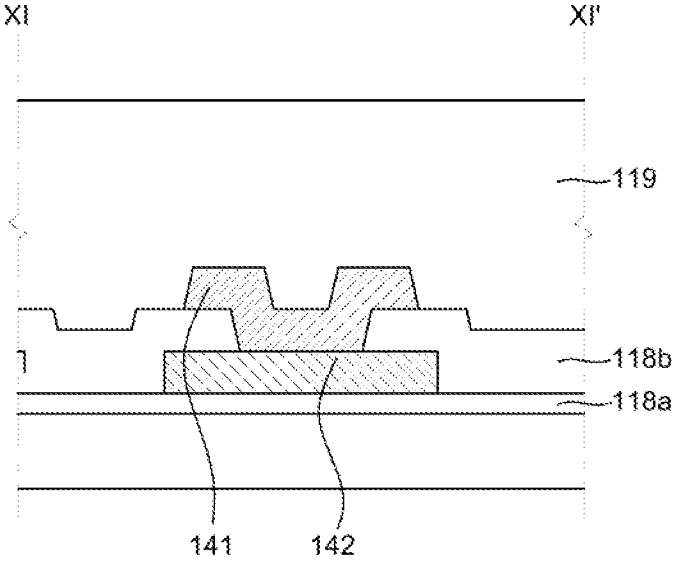
FIG. 11D is a cross-sectional view taken along line XI-XI' of FIG. 11C.

FIG. 11A is a schematic plan view illustrating area X of FIG. 1A. FIG. 11B is a schematic plan view illustrating area A of FIG. 11A. FIG. 11C is a schematic plan view illustrating area B of FIG. 11A. FIG. 11D is a cross-sectional view taken along line XI-XI' of FIG. 11C.

Referring to FIGS. 11A and 11B together, the ground line GND disposed in the non-display area NDA may extend to the optical electronic device 170 which overlaps with the normal area NA and the first optical area DA1 through the connection line CL.

Specifically, the ground line GND extends from the non-display area NDA to be electrically connected to the connection line CL.

At this time, the ground line GND is disposed on the same layer as the plurality of touch electrodes 140 and formed of the same material and the connection line CL may be disposed on the same layer as the ground line GND and formed of the same material.

In other words, the connection line CL is electrically connected to the ground line GND disposed in the non-display area NDA and may be branched from the ground line GND.

Hereinafter, the connection of the ground line GND in the connection area B of the first optical area DA1 and the normal area NA will be described with reference to FIGS. 11C and 11D.

In the normal area NA, the ground line GND is formed on the same layer as the plurality of touch electrodes 140 and the connection line CL branched from the ground line GND is connected to the optical electronic device 170 which overlaps with the first optical area DA1.

The connection line CL branched from the ground line GND may be in contact with the plurality of shielding patterns 145 disposed in the first optical area DA1 through the boundary between the first optical area DA1 and the normal area NA, that is, a contact hole CH disposed in the connection area (B area).

Therefore, the ground line GND disposed in the non-display area NDA is electrically connected to the plurality of shielding patterns 145 disposed in the first optical area DA1 to be applied with the ground voltage. Therefore, the plurality of shielding patterns 145 serves as a ground which blocks the touch noise during the touch driving to effectively shield the touch noise.

Hereinafter, the effects of the present disclosure will be described in more detail with reference to Exemplary Aspect and Comparative Aspects. However, the following Exemplary Aspects are set forth to illustrate the present disclosure, but the scope of the disclosure is not limited thereto.

Figure 12:
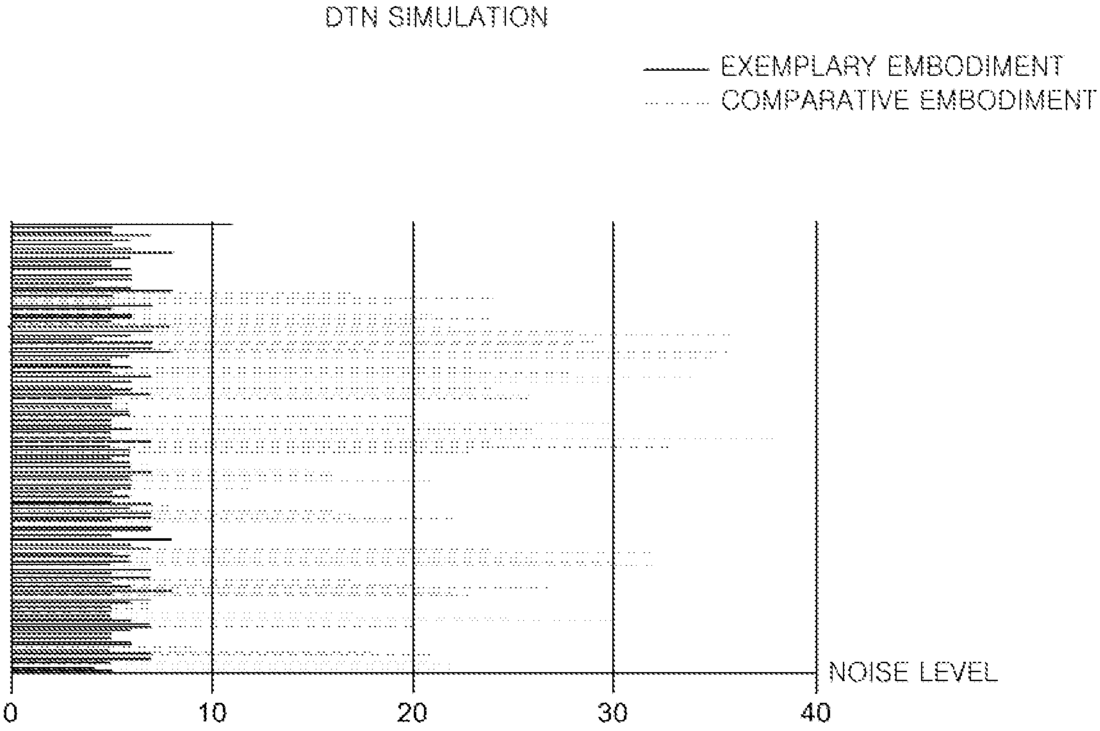
FIG. 12 is a display touch noise (DTN) simulation result according to Exemplary Aspect of the present disclosure and Comparative Aspect.

FIG. 12 is a display touch noise (DTN) simulation result according to Exemplary Aspect of the present disclosure and Comparative Aspect.

To find out the effect of the present disclosure, as Exemplary Aspect of the present disclosure, as illustrated in FIG. 10, a display device with a structure in which a plurality of shielding patterns was disposed to overlap with the plurality of touch electrodes adjacent to the plurality of transmission areas in the first optical area was manufactured. Further, as Comparative Aspect of the present disclosure, a display device with a structure in which only the plurality of touch electrodes adjacent to the plurality of transmission areas in the first optical area was disposed was manufactured.

As illustrated in FIG. 12, it was confirmed that in the case of the display device according to Exemplary Aspect including the plurality of shielding patterns disposed to overlap with the plurality of touch electrodes adjacent to the plurality of transmission areas, a touch noise level during the touch driving was significantly lower than the display device according to Comparative Aspect in which only the plurality of touch electrodes adjacent to the plurality of transmission areas was disposed.

By the experiment, it was confirmed that the display device of the present disclosure included the plurality of shielding patterns to overlap with the plurality of touch electrodes adjacent to the plurality of transmission areas of the first optical area to suppress the touch noise generated during the touch driving.

Figure 13:
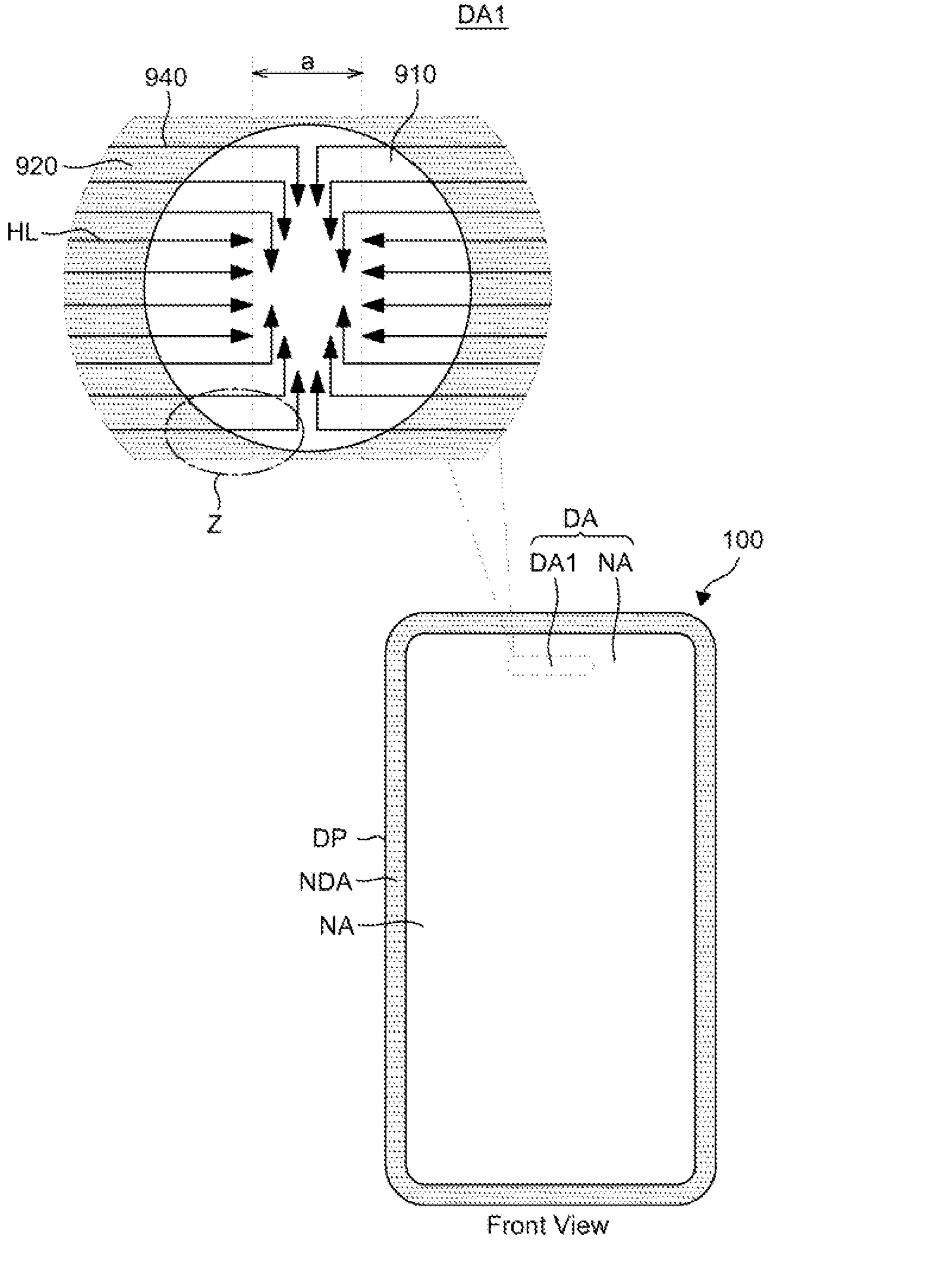
FIG. 13 is a plan view illustrating a first optical area of a flexible display device according to another exemplary aspect of the present disclosure.

FIG. 13 is a plan view illustrating a first optical area of a flexible display device according to another exemplary aspect of the present disclosure.

Figure 14:
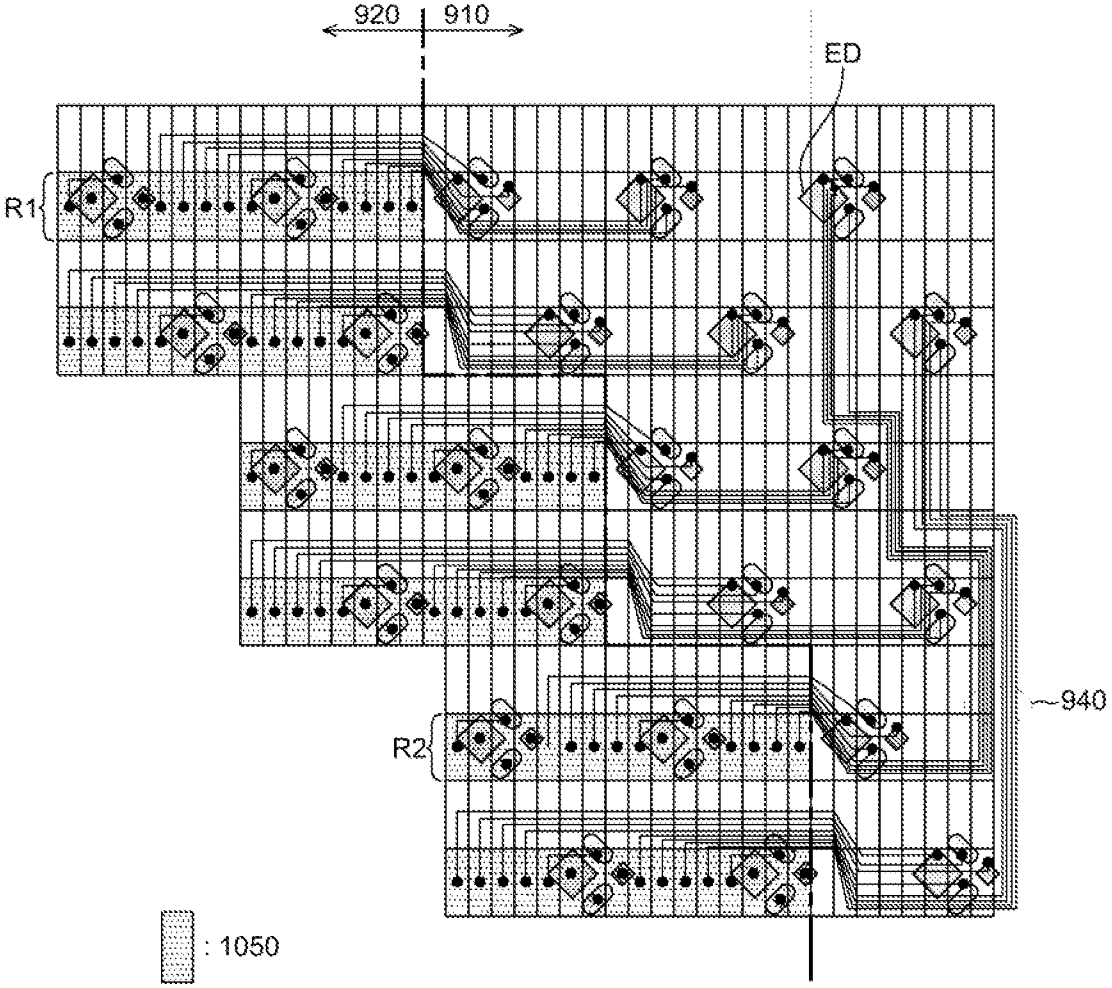
FIG. 14 is a view for enlarging area Z of FIG. 13.

FIG. 14 is a view for enlarging area Z of FIG. 13.

First, referring to FIG. 13, the first optical area DA1 may include a center area 910 and a bezel area 920 located on the outer periphery of the center area 910. For example, the center area 910 may include a plurality of transmission areas.

The first optical area DA1 may include a plurality of horizontal lines HL. Transistors located in the bezel area 920 and light emitting diodes located in the center area 910 may be connected by the plurality of horizontal lines HL.

The flexible display device 100 according to the exemplary aspect may include a routing structure 940. The routing structure 940 is included so that the center area 910 may be expanded by a predetermined area a. This is because the pixel located in the predetermined area a is connected to the transistor located in the bezel area 920 by the routing structure 940.

The structure of the first optical area DA1 including the routing structure 940 will be reviewed in detail as follows.

Referring to FIG. 14, the first optical area may include a plurality of light emitting diodes ED disposed in the center area 910 and the bezel area 920. The first optical area includes the plurality of light emitting diodes ED so that the first optical area may display a screen.

The first optical area may include a plurality of transistors 1050 located in the bezel area 920. In the center area 910, the transistor 1050 may not be located. Since the transistor 1050 is not located in the center area 910 so that the center area 910 may have a higher transmittance.

The first optical area may include a plurality of rows and include a first row R1 and a second row R2. The plurality of rows included in the first optical area is an arbitrary area which horizontally crosses the first optical area to be defined by a pattern of the transistor 1050.

The flexible display device may include a light emitting diode ED which is located in the center area 910 and located in a first row R1 and a transistor 1050 which is located in the bezel area 920 and located in a second row R2.

The flexible display device may include a routing structure 940 which electrically connects the light emitting diode ED located in the first row R1 and the transistor 1050 located in the second row R2.

The transistor 1050 and the light emitting diode ED which are located on different rows may be connected by the routing structure 940. Therefore, a transistor 1050 located in a row in which transistors 1050 more than the light emitting diodes ED are disposed and a light emitting diode located in a row in which light emitting diodes ED more than the transistors are disposed may be connected to each other.

The number of light emitting diodes ED included in the first row R1 in the center area 910 may be much larger than the number of light emitting diodes ED included in the second row R2 in the bezel area 920. Accordingly, to drive the light emitting diode ED included in the first row R1, a greater number of transistors 1050 is necessary and to drive the light emitting diode ED included in the second row R2, a smaller number of transistors 1050 is necessary. Accordingly, among the transistors 1050 located in the second row R2 of the bezel area 920, a surplus transistor 1050 which is not electrically connected to the light emitting diode ED located in the second row R2 may be electrically connected to the light emitting diode ED located in the first row R1 by the routing structure 940.

In the entire center area 910, the number of pixels for every unit area may be substantially the same. When the number of pixels for every unit area is substantially the same, for example, it means that one pixel pattern is substantially uniform in the entire center area 910. Accordingly, in the first row R1 having the area overlapping with the center area 910 larger than the second row R2, a greater number of light emitting diodes ED may be located.

For example, the number of transistors 1050 included in the first row R1 of the bezel area 920 may be substantially the same as the number of transistors 1050 included in the second row R2 of the bezel area 920. In the example, if the number of light emitting diodes ED included in the first row R1 in the center area 910 is larger and the number of light emitting diodes ED included in the second row R2 in the center area 910 is smaller, some of the transistors 1050 included in the second row R2 is not electrically connected to the light emitting diode ED located in the second row R2, but may be electrically connected to the light emitting diode ED located in the first row R1.

Further, in the entire bezel area 920, the number of transistors 1050 for every unit area may be substantially the same. When the pattern of the transistor for every unit area is substantially the same, it means that one transistor pattern in the entire bezel area 920 is substantially uniform.

An area of the bezel area 920 which overlaps with the first row R1 may be substantially the same as an area of the bezel area 920 which overlaps with the second row R2. In such an example, the number of transistors 1050 located in the first row R1 of the bezel area 920 may be substantially the same as the number of transistors 1050 included in the second row R2 of the bezel area.

When the bezel area 920 is configured as described above, the number of transistors 1050 located in a row of the bezel area 920 may be maintained to be constant and a surplus transistor in a specific row may be electrically connected to a surplus light emitting diode in the other row by the routing structure 940. Accordingly, the flexible display device according to the exemplary aspect may have a larger center area 910 than a flexible display device of a comparative aspect.

The exemplary aspects of the present disclosure may also be described as follows:

According to an aspect of the present disclosure, a display device, comprising a substrate which includes a display area including a first optical area and a normal area and a non-display area, a planarization layer disposed on the substrate in the display area, a plurality of light emitting diodes which is disposed on the planarization layer and includes an anode, an emission layer, and a cathode, a bank which is disposed to cover an end of the anode on the planarization layer, an encapsulation unit which is disposed to cover the plurality of light emitting diodes and the bank, a touch sensing unit which is disposed on the encapsulation unit and includes a plurality of touch electrodes, and a plurality of shielding patterns which is disposed between the encapsulation unit and the plurality of touch electrodes in the first optical area, the first optical area includes a plurality of transmission areas in which the cathode exposes the bank.

The display device may further comprise an optical electronic device which is disposed to overlap with the first optical area below the substrate.

The plurality of shielding patterns may be disposed to overlap with the plurality of touch electrodes in a boundary area of the plurality of transmission areas and the plurality of light emitting diodes.

The touch sensing unit may include a touch buffer film, a touch interlayer insulating layer disposed on the touch buffer film, a plurality of touch electrodes which is disposed on the touch interlayer insulating layer and is disposed in a first direction and a second direction intersecting the first direction, and a bridge electrode which connects the plurality of touch electrodes disposed in the first direction, and the bridge electrode may be disposed on the same layer as the plurality of shielding patterns.

A width of the plurality of shielding patterns may be larger than a width of the plurality of touch electrodes.

The plurality of shielding patterns may be grounded.

The display device may further comprise a ground line which is connected to the plurality of shielding patterns.

The ground line is disposed on the same layer and may be formed of the same material as the plurality of touch electrodes.

The display device may further comprise a connection line which connects the ground line and the plurality of shielding patterns.

The plurality of transmission areas may have a circular shape, a triangular shape, an oval shape, a rectangular shape, or a polygonal shape.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a substrate which includes a non-display area and a display area including a first optical area and a normal area;

a planarization layer disposed on the substrate in the display area;

a plurality of light emitting diodes disposed on the planarization layer and including an anode, an emission layer, and a cathode;

a bank disposed to cover an end of the anode on the planarization layer;

an encapsulation unit disposed to cover the plurality of light emitting diodes and the bank;

a touch sensing unit disposed on the encapsulation unit and including a plurality of touch electrodes; and a plurality of shielding patterns disposed between the encapsulation unit and the plurality of touch electrodes in the first optical area, wherein the first optical area includes a plurality of transmission areas in which the cathode exposes the bank, wherein the touch sensing unit includes a touch buffer film, a touch interlayer insulating layer disposed on the touch buffer film, a plurality of touch electrodes disposed on the touch interlayer insulating layer and disposed in a first direction and a second direction intersecting the first direction, and a bridge electrode which connects the plurality of touch electrodes disposed in the first direction, and wherein the bridge electrode is disposed on a same layer as the plurality of shielding patterns.

2. The display device according to claim 1, further comprising an optical electronic device disposed to overlap with the first optical area below the substrate.

3. The display device according to claim 1, wherein the plurality of shielding patterns overlap with the plurality of touch electrodes in a boundary area of the plurality of transmission areas and the plurality of light emitting diodes.

4. The display device according to claim 1, wherein a width of the plurality of shielding patterns is larger than a width of the plurality of touch electrodes.

5. The display device according to claim 1, wherein the plurality of shielding patterns is grounded.

6. The display device according to claim 5, further comprising a ground line which is connected to the plurality of shielding patterns.

7. The display device according to claim 6, wherein the ground line is disposed on a same layer and formed of a same material as the plurality of touch electrodes.

8. The display device according to claim 6, further comprising a connection line which connects the ground line and the plurality of shielding patterns.

9. The display device according to claim 1, wherein the plurality of transmission areas has one of a circular shape, a triangular shape, an oval shape, a rectangular shape, and a polygonal shape.

10. The display device according to claim 1, wherein the first optical area includes a center area and a bezel area located on the outer periphery of the center area, the plurality of transmission areas is located in the center area, and no transistor is disposed in the center area, and a light emitting diode of the plurality of light emitting diodes disposed in the center area is electrically connected to a transistor disposed in the bezel area.

11. The display device according to claim 1, wherein the bridge electrode is formed of a same material as the plurality of shielding patterns.

* * * * *